United States Patent
Minda

(10) Patent No.: US 7,642,647 B2
(45) Date of Patent: Jan. 5, 2010

(54) SEMICONDUCTOR DEVICE

(75) Inventor: Hiroyasu Minda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 62 days.

(21) Appl. No.: 11/133,280

(22) Filed: May 20, 2005

(65) Prior Publication Data

US 2005/0258540 A1 Nov. 24, 2005

(30) Foreign Application Priority Data

May 20, 2004 (JP) .............................. 2004-150712

(51) Int. Cl.
*H01L 23/48* (2006.01)
(52) U.S. Cl. .................................................. 257/738
(58) Field of Classification Search ................. 257/772, 257/779–781, 773–738
See application file for complete search history.

(56) References Cited

U.S. PATENT DOCUMENTS

| | | | | |
|---|---|---|---|---|
| 5,767,010 A * | 6/1998 | Mis et al. | ..................... | 438/614 |
| 6,107,180 A * | 8/2000 | Munroe et al. | .............. | 438/613 |
| 6,417,089 B1 | 7/2002 | Kim et al. | | |
| 6,689,680 B2 * | 2/2004 | Greer | ........................ | 438/614 |
| 6,774,026 B1 * | 8/2004 | Wang et al. | .................. | 438/612 |
| 6,819,002 B2 * | 11/2004 | Chen et al. | ................... | 257/779 |
| 7,064,446 B2 * | 6/2006 | Barnak et al. | ................ | 257/779 |
| 2002/0017553 A1 * | 2/2002 | Jao | ............................. | 228/215 |
| 2004/0183195 A1 * | 9/2004 | Huang et al. | ................. | 257/737 |
| 2005/0224966 A1 * | 10/2005 | Fogel et al. | .................. | 257/737 |

FOREIGN PATENT DOCUMENTS

| | | |
|---|---|---|
| JP | 10-098044 | 4/1998 |
| JP | 11-186309 | 7/1999 |
| JP | 2001-93928 | 4/2001 |
| JP | 2001-257210 | 9/2001 |
| JP | 2002-026056 | 1/2002 |
| JP | 2004-048012 | 2/2004 |

* cited by examiner

*Primary Examiner*—Dao H Nguyen
*Assistant Examiner*—Tram H Nguyen
(74) *Attorney, Agent, or Firm*—Young & Thompson

(57) ABSTRACT

A semiconductor device, in which it is possible to maintain high reliability in that interfacial breakdown does not occur between a solder ball and a conductive film, is provided. The semiconductor device according to the present invention comprises an uppermost layer interconnection 101, an insulating film, which is provided above the uppermost layer interconnection 101, provided with a pad via 104 reaching the uppermost layer interconnection 101, and a conductive film, which is connected to the uppermost layer interconnection 101 in a bottom of the pad via 104, and formed across from the bottom of the pad via 104 to outside the pad via 104; wherein the conductive film and the solder ball 108 provided in contact with the insulating film, and an alloy layer 110 containing a metallic element contained in the solder ball 108 and a metallic element contained in the conductive film intervene, and the solder ball is formed so as to cover the alloy layer 110.

23 Claims, 18 Drawing Sheets

SEMICONDUCTOR DEVICE

This application is based on Japanese patent application NO. 2004-150712, the content of which is incorporated hereinto by reference.

BACKGROUND OF THE INVENTION

1. Field of the Invention

The present invention relates to a semiconductor device provided with a bump structure used for a flip-chip mounting.

2. Description of Related Art

In recent years promoted energetically is realization of lead-free in design of the soldering for flip-chip mounting while taking into consideration of environmental problems.

As for lead-free solders, there are indicated ones, which contain Sn, Ag and Cu. On the contrary, when forming a solder ball on a pad using such solders, in some cases, interfacial peelings or interfacial breakdowns occur between the pads and the solder balls.

Japanese Laid-Open Patent Publication No. 2001-93928 proposes technology to suppress such interfacial peelings. The technology described in the Japanese Laid-Open Patent Publication No. 2001-93928 forms the copper diffusion prevention film such as Ni, Cr or the like on the copper pad so that the copper is prevented from reaching the surface of the solder ball with the copper diffused from the viewpoint that the intermetallic compound is the factor, which causes the interfacial peeling of the solder ball to occur. In such a way as above, this enhances reliability of the semiconductor device while suppressing interfacial peeling occurring at the interface between the copper pad and the solder ball.

However, even the technology described in the Japanese Laid-Open Patent Publication No. 2001-93928, there is still room for further improvement concerning the point such as solder bump adhesion or the like. In addition, in the technology described in the same literature, it is made preferable to form metal film such as Palladium film between the copper diffusion prevention film and the solder ball to ensure solder adhesion. However, in some cases, long term reliability of the pad portion cannot be obtained sufficiently.

In addition, the semiconductor device is increasingly in the case where the product is used under severe environment; and level of reliability required for the pad portion becomes higher.

In such a situation, new technology to suppress the interfacial peeling and to improve reliability of the product is strongly required.

SUMMARY OF THE INVENTION

The present inventor has obtained the following knowledge upon studying mechanism of occurrence of the interfacial breakdown.

FIG. 24 exemplifies representative bump structure using the lead-free solder. A cap layer 102 is formed above an uppermost layer interconnection 101 of a multilayered interconnection layer embedded in an insulating film 100, and a passivation film 103, and an insulating resin layer 105 are formed above the cap layer 102 in this order. The passivation film 103 is provided with a pad via 104, and a barrier metal film 106 and an UBM film 107 are formed along the pad via 104.

A solder ball 108 is provided above the UBM film 107. Here, formed is an alloy layer 110 formed with copper, nickel and tin contained in the solder bump at the interface between the solder ball 108 and the UBM film 107. This alloy layer, as described later, is formed in such a way as to be subjected to a heat treatment process such as a reflow process.

According to the study of the present inventor, the interfacial breakdown occurs by the following reason. That is, residual thermal stress occurs in the solder ball caused by difference of thermal expansion coefficient between a substrate and a chip in the solder ball connected between the substrate and the chip. When the residual thermal stress exceeds tolerance, the breakdown portion occurs on alloy layer 110 with small mechanical strength, followed by crack propagating into the alloy layer 110 with this place as a point of origin, resulting in the interfacial breakdown. Thus, the interfacial breakdown generally occurs by the fact that the crack is generated in the alloy layer 110 caused by the thermal stress. The present inventor has discovered that, in particular, when there is a portion where the alloy layer 110 is exposed in that the alloy layer 110 is not covered with the solder ball, the interfacial breakdown is easy to occur. It should be noted that the term of this "interfacial breakdown" corresponds to the "interfacial peeling" of the Japanese Laid-Open Patent Publication No. 2001-9392.

The present inventor has achieved the following invention based on such a new knowledge.

In order to solve the above mentioned problem, a semiconductor device according to the present invention in which a solder ball is provided above an electrode via a conductive film is characterized in that an alloy layer containing a metallic element contained in the solder ball and a metallic element contained in the conductive film is formed between the conductive film and the solder ball; and the solder ball is formed so as to cover the alloy layer.

In addition, the semiconductor device according to the present invention is characterized in that the semiconductor device comprises an interconnection, an insulating film, which is provided above the interconnection, providing a hole reaching the interconnection, a conductive film, which is connected to the interconnection in a bottom of the hole and formed across the bottom of the hole to outside the hole, and a solder ball provided in such a way as to come into contact with the conductive film and the insulating film; wherein an alloy layer containing metallic elements contained in the solder ball and metallic elements contained in the conductive film is formed between the conductive film and the solder ball, and the solder ball is formed so as to cover the alloy layer.

In the semiconductor device, the insulating film may be constituted by forming a protection layer provided above the interconnection and an insulating resin layer provided above the protection layer into layered structure in this order.

In the semiconductor device in either of the above ones, the conductive film contains at least copper and nickel, contains a ball underlying metal film containing at least material indicating wettability to the solder, which is subjected to reflow to a face being in contact with the solder ball.

In the semiconductor device, at least one kind of metal of copper, gold and chrome may be contained in the ball underlying metal film in its face coming into contact with the solder ball.

In the semiconductor device, the conductive film may be comprised of the ball underlying metal film, a metal film in which a solder subjected to reflow to a face being in contact with the ball underlying metal film contains at least material indicating wettability, and a barrier metal film.

Further, in the semiconductor device, the metal film may be formed between the ball underlying metal film and the barrier metal film; and the barrier metal film may have at least a titanium layer on its face being in contact with the metal film. Or in the semiconductor device, the barrier metal film may be composed of at least a titanium layer and a titanium-tungsten layer in the order from a face being in contact with the metal film.

In addition, in the semiconductor device, the barrier metal film and the metal film may be formed to be exposed to the exterior of the terminal side than the ball underlying metal film; and the solder ball may be formed at least so as to seal the metal film and the ball underlying metal film.

Further, in the semiconductor device, the terminal part of the solder ball is capable of being positioned outside the terminal part of the ball underlying metal film with not less than 10 μm separated.

In the semiconductor device, the solder ball is composed of a lead-free solder containing tin.

By such a constitution, even though the alloy layer is formed between the solder ball and the conductive film, it results in the state where the solder ball is formed so as to cover the alloy layer. Consequently, since the alloy layer is not exposed to the outside, it is possible to produce the case where the interfacial breakdown caused by existence of the alloy layer does not occur.

In addition, the metal film is wet with molten solder upon exposing the barrier metal film and the metal film included in the conductive film more outside than the ball underlying metal film, it is possible to get wet with molten solder securely up to a side wall of the ball underlying metal film, it is possible to suppress constitution, in which the sidewall of the ball underlying metal film is exposed. Thereby, it is possible to suppress occurrence of the interfacial breakdown caused by existence of the alloy layer.

According to the present invention, it is possible to provide the semiconductor device capable of maintaining high reliability without occurrence of the interfacial breakdown between the solder ball and the conductive film.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENT

Figure 1:
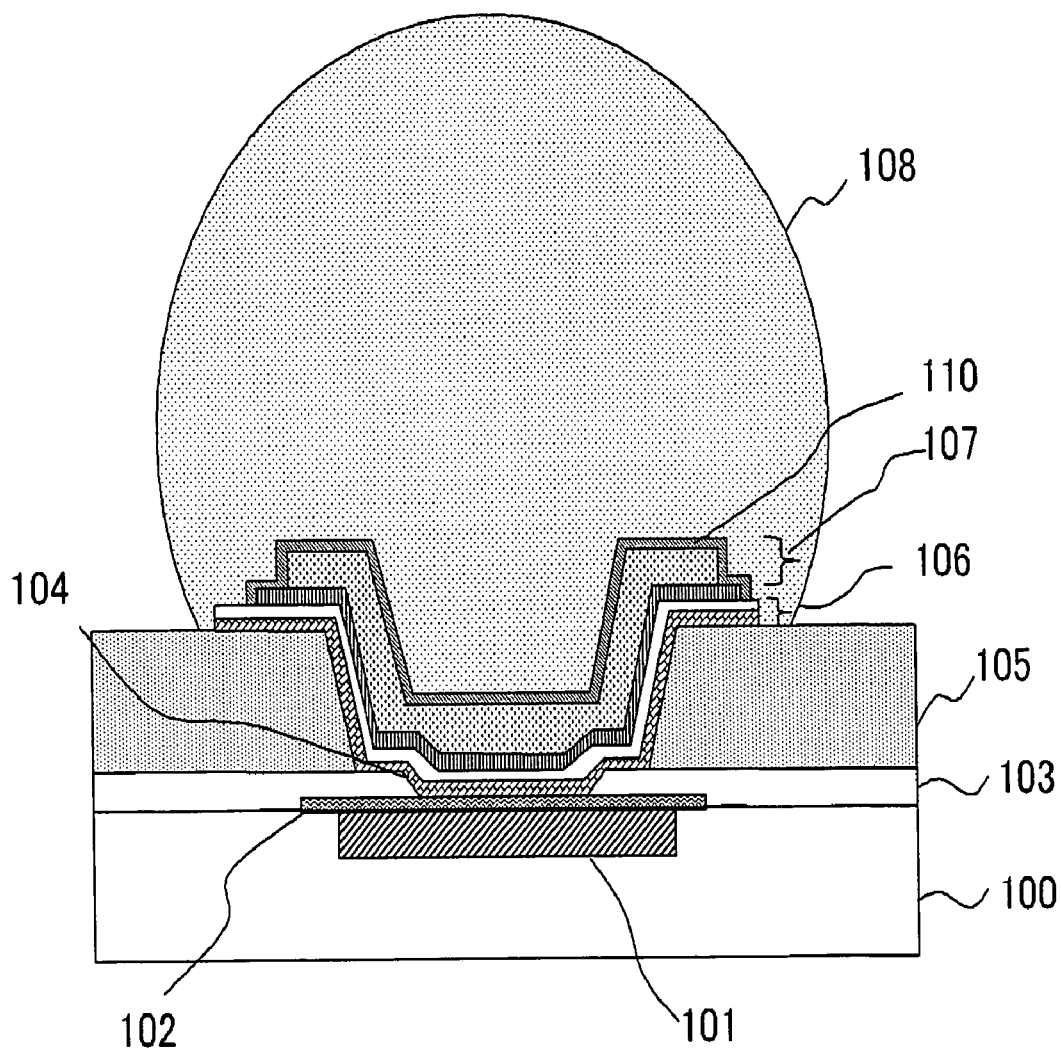
FIG. 1 is a diagram showing a principal part of a semiconductor device according to the first embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposed.

Hereinafter, there will be described a semiconductor device according to the present invention in detail while referring to the drawings.

It should be noted that, in the description of the drawings, duplicate description is omitted while adding the same sign to the same element.

First Embodiment

FIG. 1 is a diagram showing a principal part of the semiconductor device according to the first embodiment.

In FIG. 1, the semiconductor device comprises an uppermost layer interconnection 101, which is an interconnection electrically connecting to an internal circuit, a passivation film 103 and an insulating resin layer 105, which are provided above the uppermost layer interconnection 101 and form an insulating film provided with a pad via 104 to be a hole reaching this uppermost layer interconnection 101, a barrier metal film 106, a metal film and an UBM film 107 (under ball metal or under bump metal), which are connected to the uppermost layer interconnection 101 in a bottom of the pad via 104 and form a conductive film formed across from the bottom of the pad via 104 to outside the pad via 104, the solder ball 108 provided while coming into contact with the conductive film and the insulating film, and an alloy layer 110, which is formed on the interface between the solder ball 108 and the UBM film 107 and is formed on the interface between the solder ball 108 and the metal film above the barrier metal film 106. The alloy layer 110 is constituted by containing a metallic element contained in the solder ball 108 and a metallic element contained in the conductive film.

The insulating resin layer 105 is provided in such a way as to come into contact with the solder ball 108, and performs work as a stress buffer layer to relax stress occurring at a forming process of the solder ball 108 and a manufacturing process after the solder ball forming process. As for the material of the insulating resin layer 105, it is possible to use polyimide, polybenzoxazole or the like. Although it is preferable that film thickness (finished dimension after baking described later) of the insulating resin layer 105 is made 1 to 10 µm, in the present embodiment, the film thickness is made 7 µm.

The uppermost layer interconnection 101 is formed of conductive materials such as copper, aluminum, or alloy thereof, and embedded in the insulating film 100. The cap layer 102 is provided between the uppermost layer interconnection 101 and an opening of the pad via 104. This uppermost layer interconnection 101 is connected to elements such as a transistor or the like constituting the semiconductor device. In addition, the uppermost layer interconnection 101 may have layered structure.

The cap layer 102 is formed of TiN, SiCN or the like, and when copper is used as uppermost layer interconnection 101, the cap layer 102 performs work to prevent copper from being diffused. The passivation film 103 formed in such a way as to cover the cap layer 102 is formed of SiON or the like, and effectively prevents moisture from entering the uppermost layer interconnection 101 and a circuit element with residing lower layer of the uppermost layer interconnection 101.

The barrier metal film 106 acts so as to prevent tin from being diffused from the solder ball 108. In addition, the barrier metal film 106 is formed in the shape that the barrier metal film is exposed outside the terminal than an UBM film 107 described later.

The UBM film 107 is a base film to form the solder ball 108, and an outermost surface of the UBM film 107 contains a substance with excellent wettability to the solder, such as for instance, copper. An alloy layer 110 formed with a metallic element included in the UBM film 107 and a metallic element included in the solder ball 108 is formed at the interface between the UBM film 107 and the solder ball 108. On the contrary, also at the interface between the UBM film 107 and the barrier metal film 106, substance with excellent wettability to the solder, for instance, the metal film constituted by containing copper, like the barrier metal film 106, is formed so as to be exposed outside the terminal of the UBM film 107. Thereby, the alloy layer 110 is formed in the interface between the solder ball 108 and the metal film of the surface of the barrier metal film 106. Here, as for a substance be contained in the outermost surface of the UBM film 107 and the metal film, for instance, copper (Cu), gold (Au), chromium (Cr) or the like are indicated; and the solder expresses excellent wettability to these elements. In the drawing, an example including copper is shown.

In the solder ball 108 connected between the substrate and the chip, the residual thermal stress occurs in the solder ball 108 caused by difference of the thermal expansion coefficient between the substrate and the chip. When this residual thermal stress exceeds tolerance, the breakdown portion occurs on alloy layer 110 with small mechanical strength, followed by crack propagating into the alloy layer 110 with this place as a point of origin, resulting in the interfacial breakdown. When the alloy layer 110 is subjected to the exterior, the interfacial breakdown is brought about easily. In order to prevent the interfacial breakdown from occurring between the solder ball 108 and the UBM film 107, it is necessary for the alloy layer 110 not to be subjected to the exterior.

Figure 24:
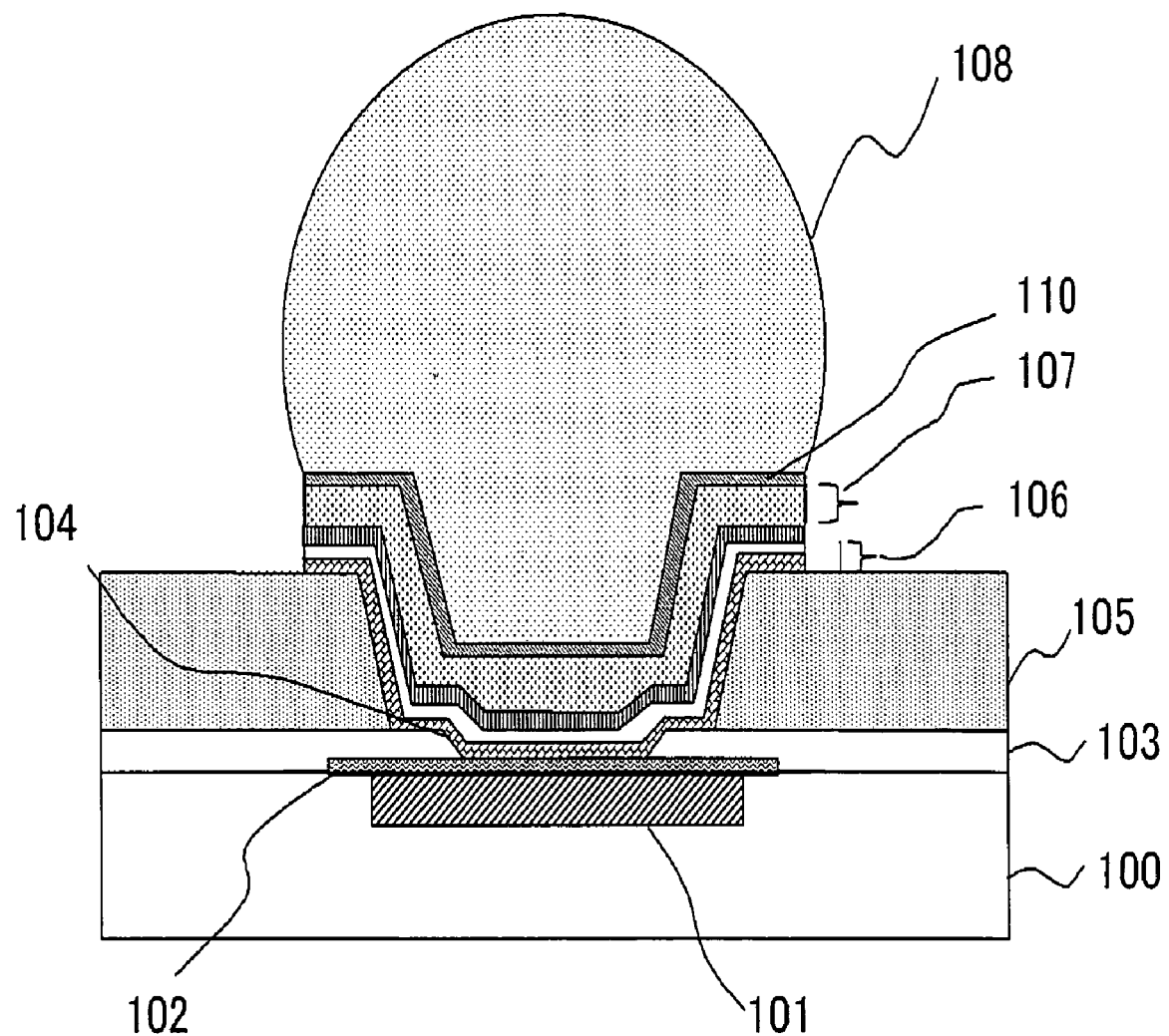
FIG. 24 is a diagram showing an enlarged part near a terminal of the solder ball of the conventional semiconductor device.

The solder ball 108 is formed with, for instance, lead-free solder. The solder ball 108 is formed so as to cover the alloy layer 110 produced between the solder ball 108 and the UBM film 107 at solder reflow process to be later process. In such a way as above, the alloy layer 110 is not subjected to the exterior, thus in this alloy layer 110, it is possible to suppress occurrence of the interfacial breakdown effectively. It should be noted that, in FIG. 1, the metal film is wet with molten solder upon making exposure the metal film more outside than the UBM film 107, it is possible to get wet with molten solder securely until a side wall of the UBM film, there is the effect of suppressing constitution, in which the sidewall of the UBM film is exposed as shown in FIG. 24.

Hereinafter, there will be described one example of the manufacturing process of bump structure shown in FIG. 1.

Figure 2:
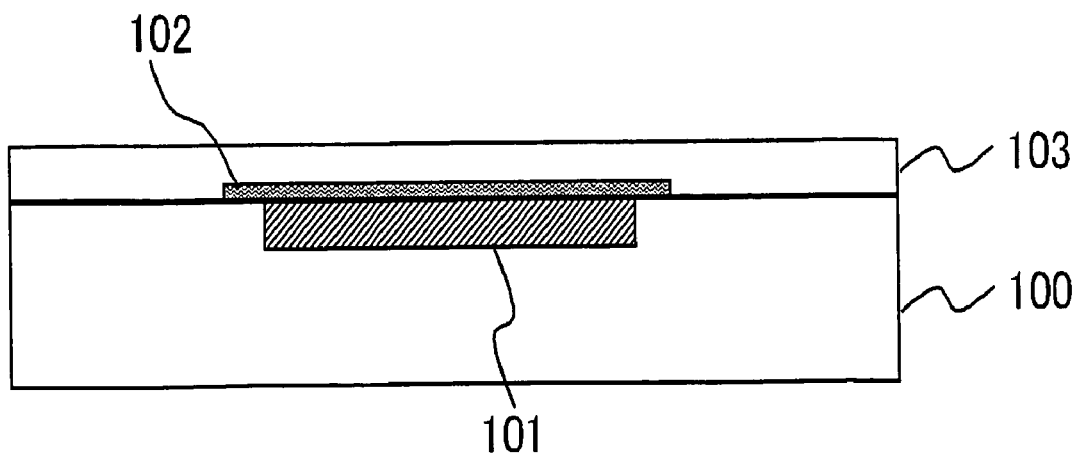
FIG. 2 is a process sectional diagram showing the first embodiment of a manufacturing process of the semiconductor device.

Initially, structure shown in FIG. 2 is manufactured. Firstly, elements are formed above a silicon substrate (not shown in the drawing) after that, multilayered copper interconnection is formed above the silicon substrate while using a damascene process. FIG. 2 shows an uppermost part of the multilayered copper interconnection. An uppermost layer interconnection 101 is embedded in the insulating film 100. A film composed of TiN or SiCN on an upper face of the insulating film 100 and the uppermost layer interconnection 101 is formed. Subsequently, a cap layer 102 is formed above the uppermost layer interconnection 101 while performing etching selectively. It should be noted that, when using SiCN to be the insulating film as a material of the cap layer 102, there is provided a contact hole to the uppermost layer interconnection 101. Next, formed is a passivation film 103 with film thickness about 0.3 to 1 µm by chemical vapor deposition method (CVD method). Thereby, there is obtained structure of FIG. 2.

Figure 3:
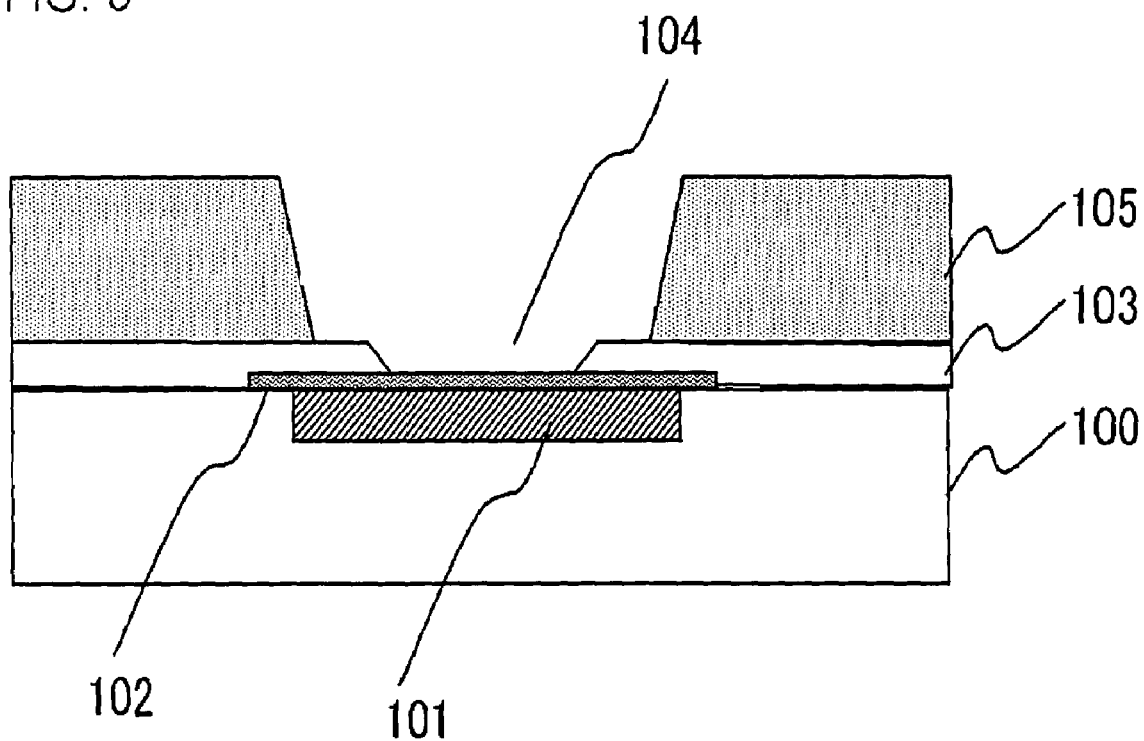
FIG. 3 is a process sectional diagram showing the first embodiment of a manufacturing process of the semiconductor device.

Next, there is provided an opening on the cap layer 102 while performing dry etching the passivation film 103 selectively. Thereafter, an insulating resin layer 105 on the whole surface of the cap layer 102 and the passivation film 103 is formed. As for the material of the insulating resin layer 105, it is possible to use polyimide, polybenzoxazole or the like to be a photosensitive material. The film thickness of the insulating resin layer 105 is set to, for instance, 1 to 10 µm. Successively, the pad via 104 at which the cap layer 102 is exposed to the bottom is formed while performing exposure using mask, which is not shown in the drawing (FIG. 3). After providing the opening, there is performed baking during 20 to 30 minutes at the temperature of degree of 350° C.

A barrier metal film 106 is obtained while forming TiW film 113, and Ti film 112 on structure provided with the pad via 104 shown in FIG. 3 by a sputtering method. Further, Cu film 111 to be substance with excellent wettability to the solder (FIG. 4) is formed. The Cu film 111 becomes an electrode of a plating method described later. Each film thickness is capable of being set to, for instance, following values.

TiW film 113: 100 to 500 nm

Ti film 112: 10 to 200 nm

Cu film 111: 100 to 500 nm

In the present embodiment, TiW film 113 is set to 200 nm, Ti film 112 is set to 30 nm, and Cu film 111 is set to 300 nm.

After that, a resist film, which is subjected to a patterning, is formed on the Cu film 111. Then, Ni film 115 (film thickness 3 μm) and Cu film 114 (film thickness 400 nm) are made to grow using the plating method. Next, the UBM film 107 (FIG. 5) is obtained upon stripping the resist film.

Figure 6:
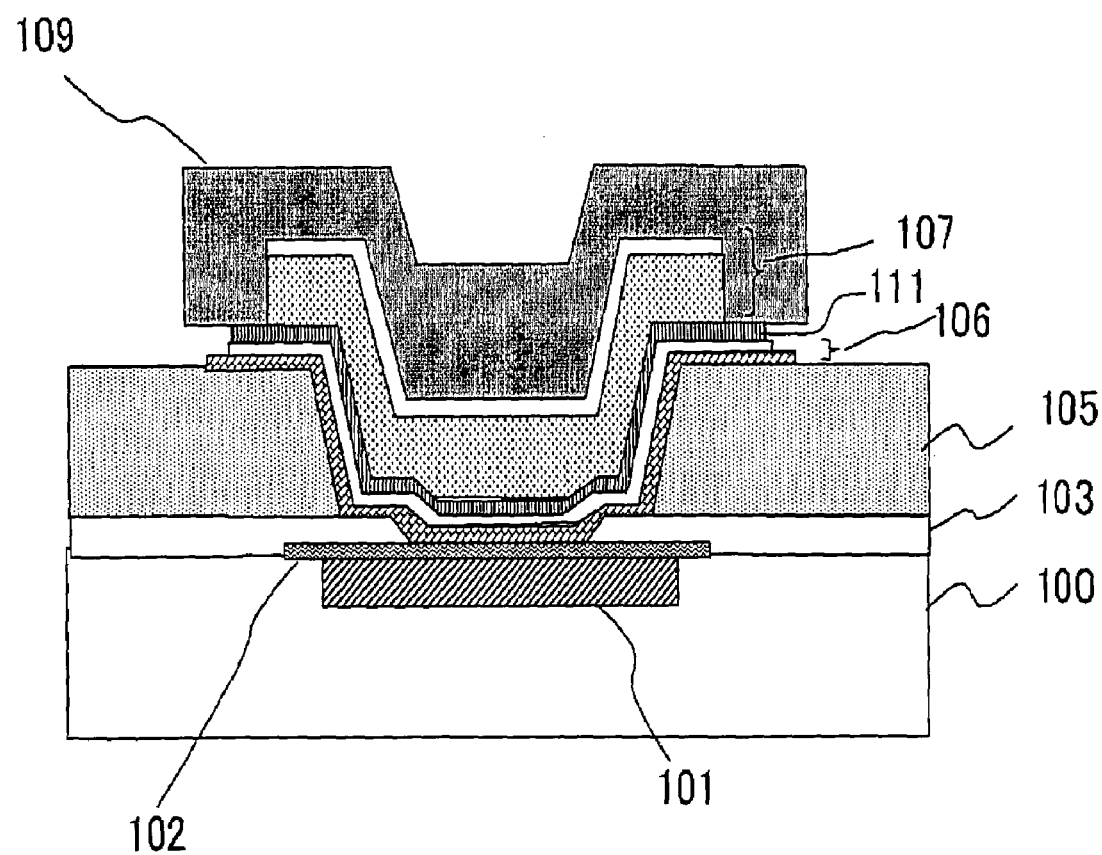
FIG. 6 is a process sectional diagram showing the first embodiment of a manufacturing process of the semiconductor device.

Successively, a resist 109, which is subjected to the patterning on the UBM film 107, is formed. Then, with the resist 109 as a mask, Cu film 111 and the barrier metal film 106 are etching-stripped selectively to separate them. With respect to the etching, it is possible to use a wet etching. In addition, with respect to TiW film 113, and Ti film 112, it is also possible to use a dry etching. However, the wet etching is used about the whole films here. FIG. 6 is a process sectional diagram showing the state after etching. Each film constituting the barrier metal film 106 has an etching speed to an etchant that is different from each other; therefore, as shown in the drawing, a step is formed at an end face.

Figure 7:
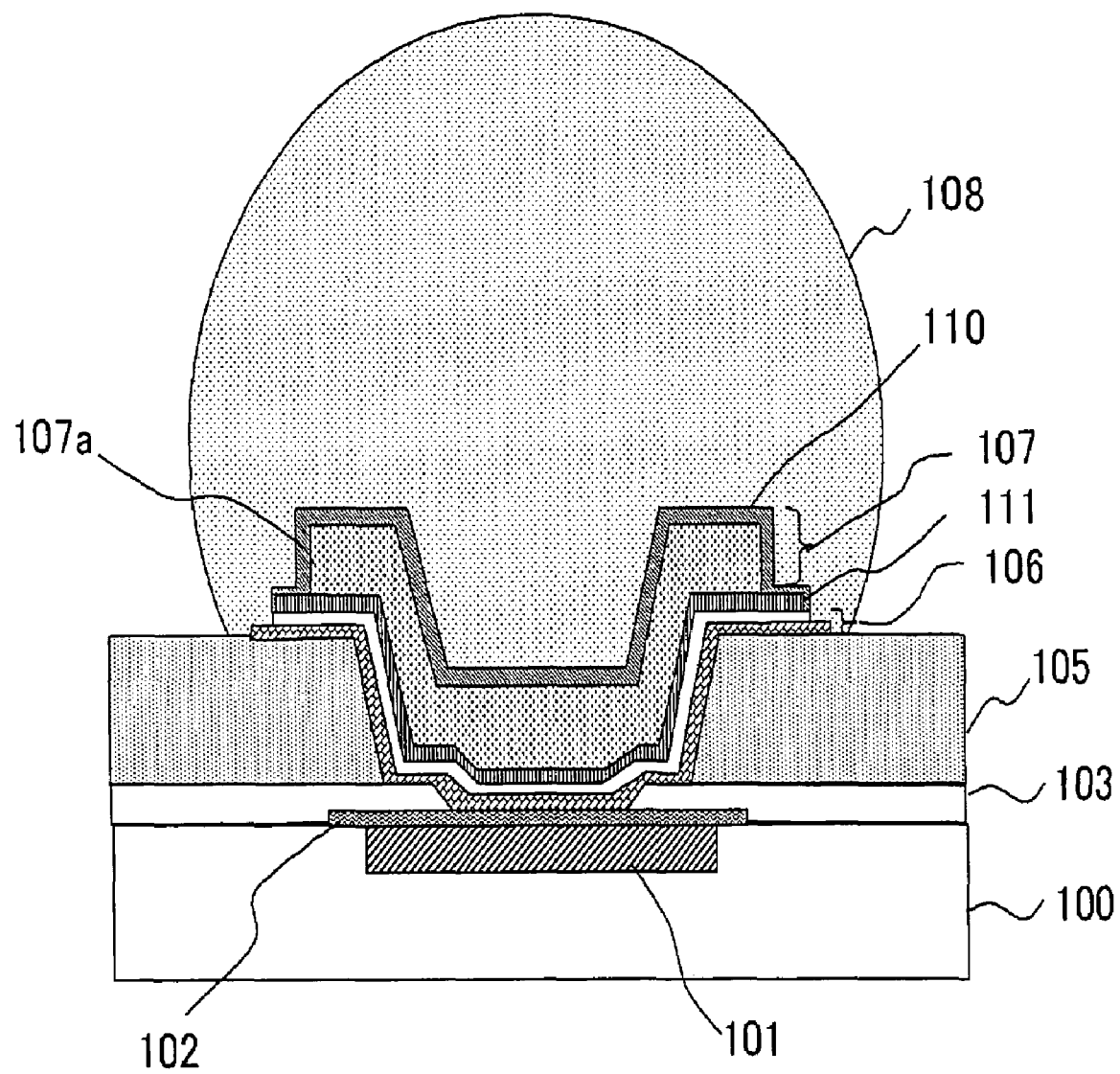
FIG. 7 is a process sectional diagram showing the first embodiment of a manufacturing process of the semiconductor device.

After that, after stripping a resist 109, the solder ball 108 is formed while coming into contact with an upper face of the UBM film 107 (FIG. 7). It is possible to use various kinds of materials for the solder ball 108. Now, in the present embodiment, the solder ball 108 is constituted of the lead-free solder containing Sn, Ag and Cu. Firstly, a mask having an opening with a pad part exposed is provided by comprising the barrier metal film 106, Cu film 111 and the UBM film 107. Then, the solder material is printed by a screen printing method. After stripping the mask, a spherical solder ball 108 is formed upon performing the reflow, for instance, at 220° C. to 265° C. At this reflow process, the alloy layer is formed in such a way that the metallic element included in the solder ball 108 and the metallic element included in the UBM film 107 are diffused mutually at the interface between the UBM film 107 and the solder ball 108. In the present embodiment, the alloy layer 110 containing Sn of the solder ball 108, and Cu and Ni of the UBM film 107 is formed. As shown in the drawing, this alloy layer 110 is formed across from an upper face of the UBM film 107 to a side face thereof. In the same way as above, the alloy layer 110 is also formed in such a way that Cu film 111 comes into contact with the solder ball 108, so that the metallic elements included in the Cu film 111 and the solder ball 108 diffuse mutually.

On the basis of the above processes, the bump structure provided with the solder ball 108 is formed. As shown in FIG. 7, the solder ball 108 is formed so as to cover the whole pad including the UBM film 107. According to this, the barrier metal film 106 and an end face of the UBM film 107 are coated with the solder ball 108. At the above described process, such structure is realized upon setting an opening of a solder printing mask to be wider than the pad.

Figure 8:
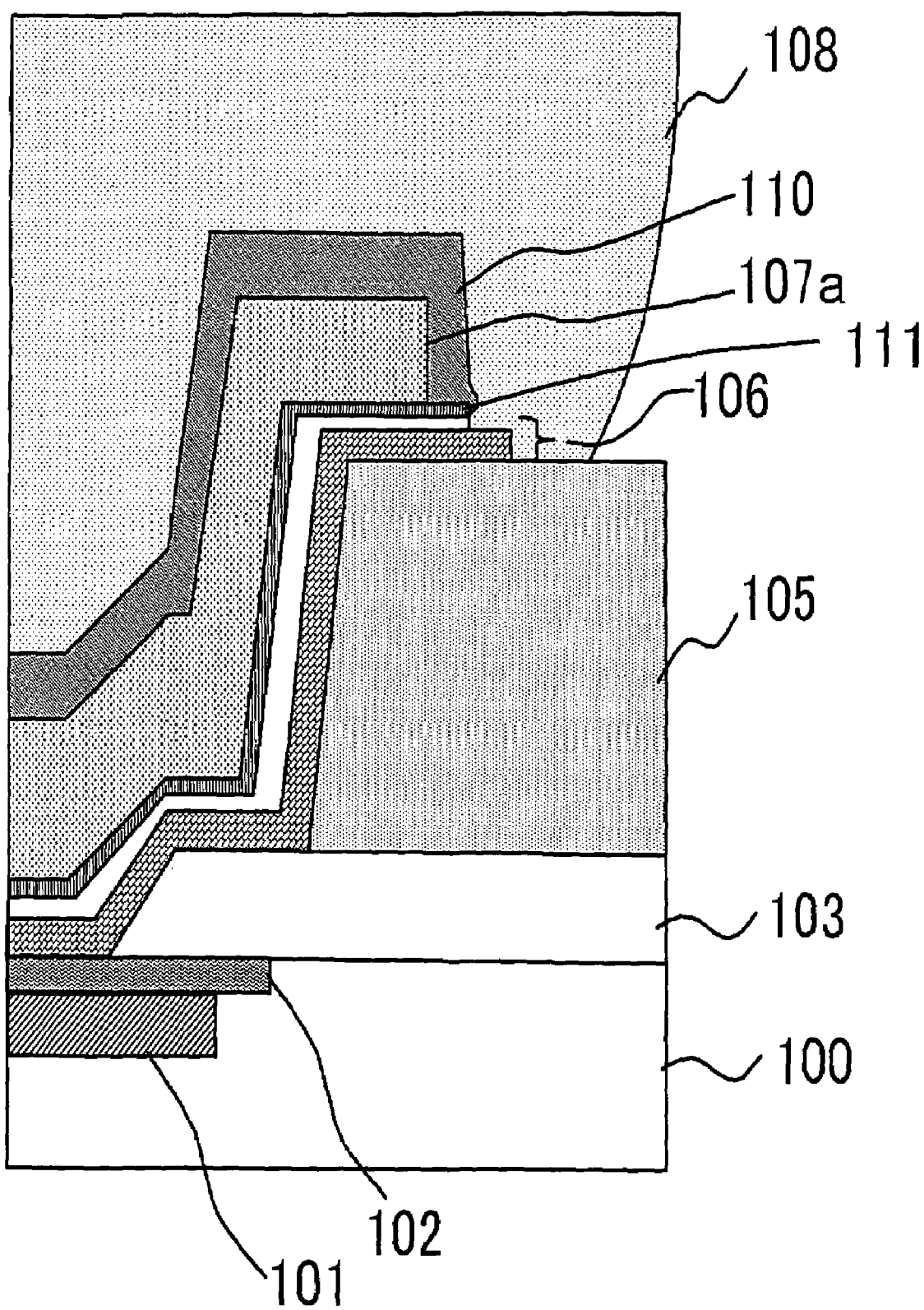
FIG. 8 is a diagram showing near a terminal part enlarged of the solder ball of the semiconductor device.

FIG. 8 is a diagram showing the solder ball 108 while enlarging a part near a terminal of the solder ball 108.

As shown in FIG. 8, in the formation process of the solder ball 108, the alloy layer 110 is formed along an end face 107a of the UBM film 107 such that the alloy layer 110 does not grow up to a terminal part of the solder ball 108. In addition, at this time, the terminal part of the solder ball 108 may be made to position outside the terminal part of the UBM film 107 by not less than 10 μm.

Figure 9:
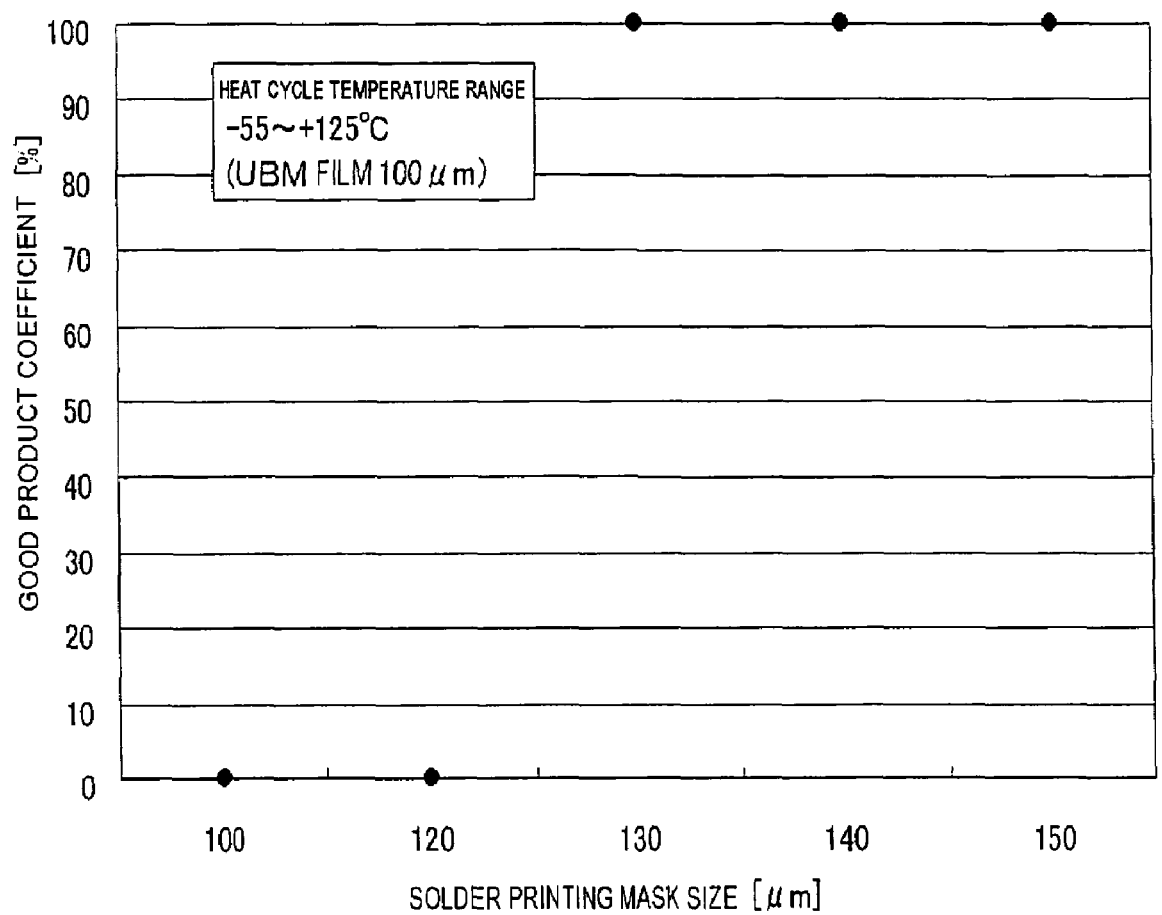
FIG. 9 is a graph showing relationship between solder printing mask dimension and a barrier metal film to form the solder ball.
Figure 21:
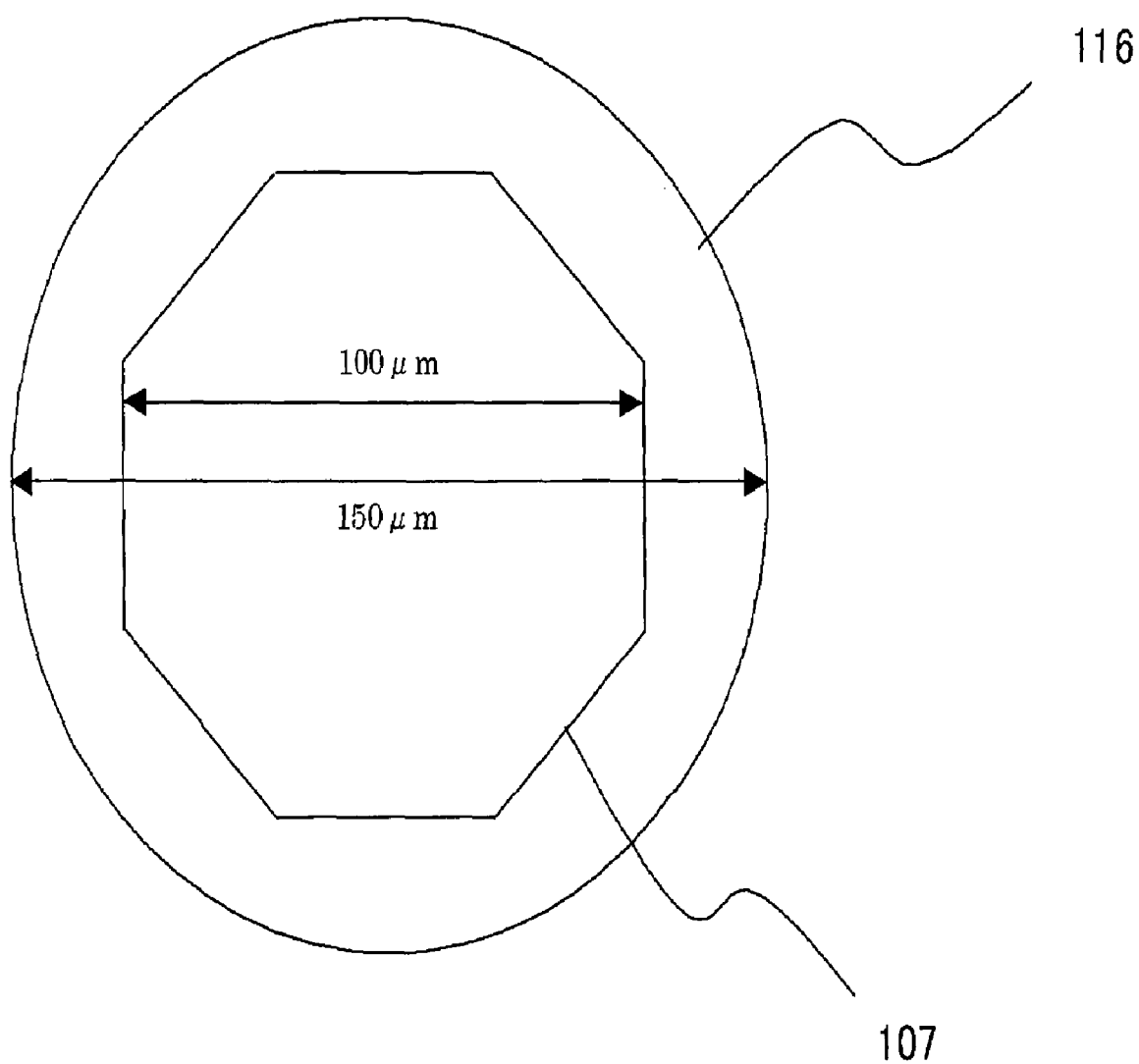
FIG. 21 is a diagram showing a shape of UBM and an opening of a solder printing mask used for an example.

FIG. 9 is a diagram showing a relationship between a solder printing mask dimension to form the solder ball 108 and a good product coefficient (%). It should be noted that, as shown in FIG. 21, dimension of the UBM film 107 is set to 100 μm. Thus, an opening (almost circular) of the solder printing mask necessary to form the solder ball 108 may result in 130 μm to 150 μm in diameter.

Figure 10:
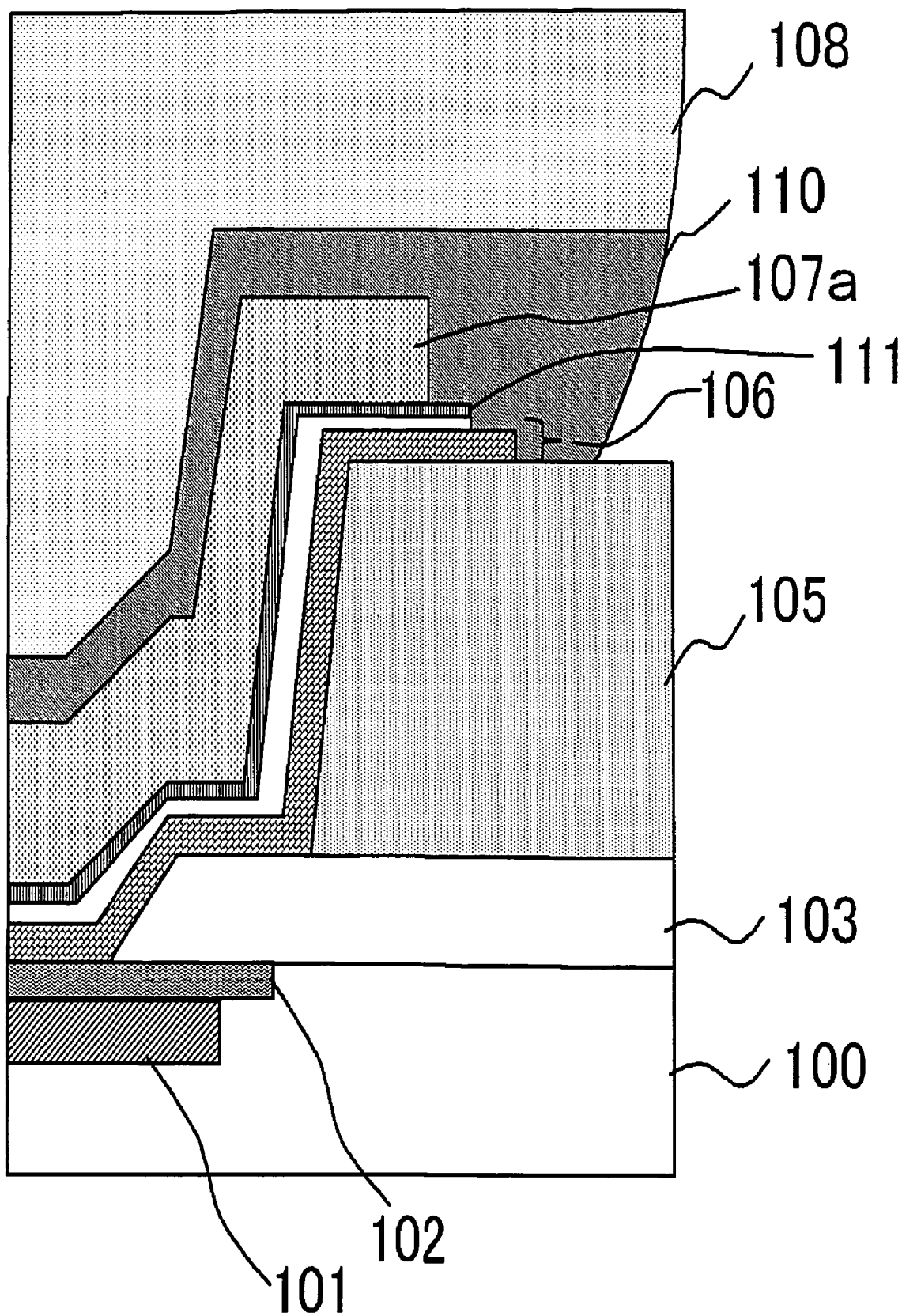
FIG. 10 is an enlarged diagram showing a part near a terminal of the solder ball of the semiconductor device whose alloy layer is exposed to outside thereof.

Thereby, in the formation process of the solder ball 108, even though the alloy layer 110 grows to be formed, this growth stops at the position along the end face 107a of the UBM film 107. That is, as shown in FIG. 10, the alloy layer 110 results in the shape where the alloy layer 110 is not exposed outside the solder ball 108. Thereby, it is possible to prevent the interfacial breakdown from occurring caused by exposure of the alloy layer 110.

Figure 5:
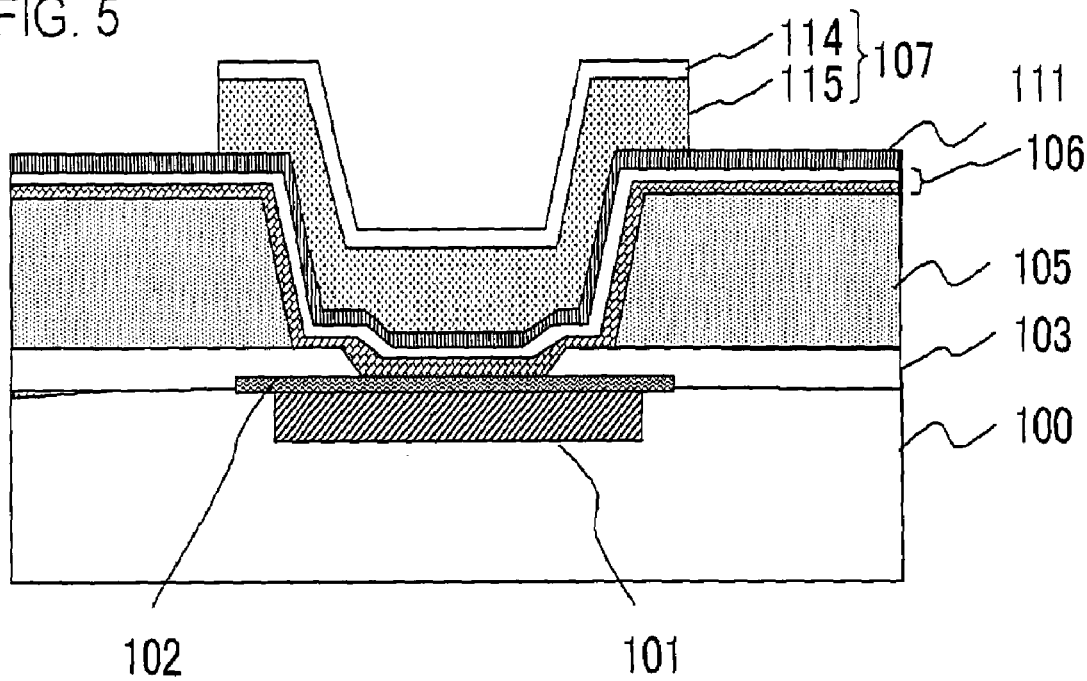
FIG. 5 is a process sectional diagram showing the first embodiment of a manufacturing process of the semiconductor device.
Figure 11:
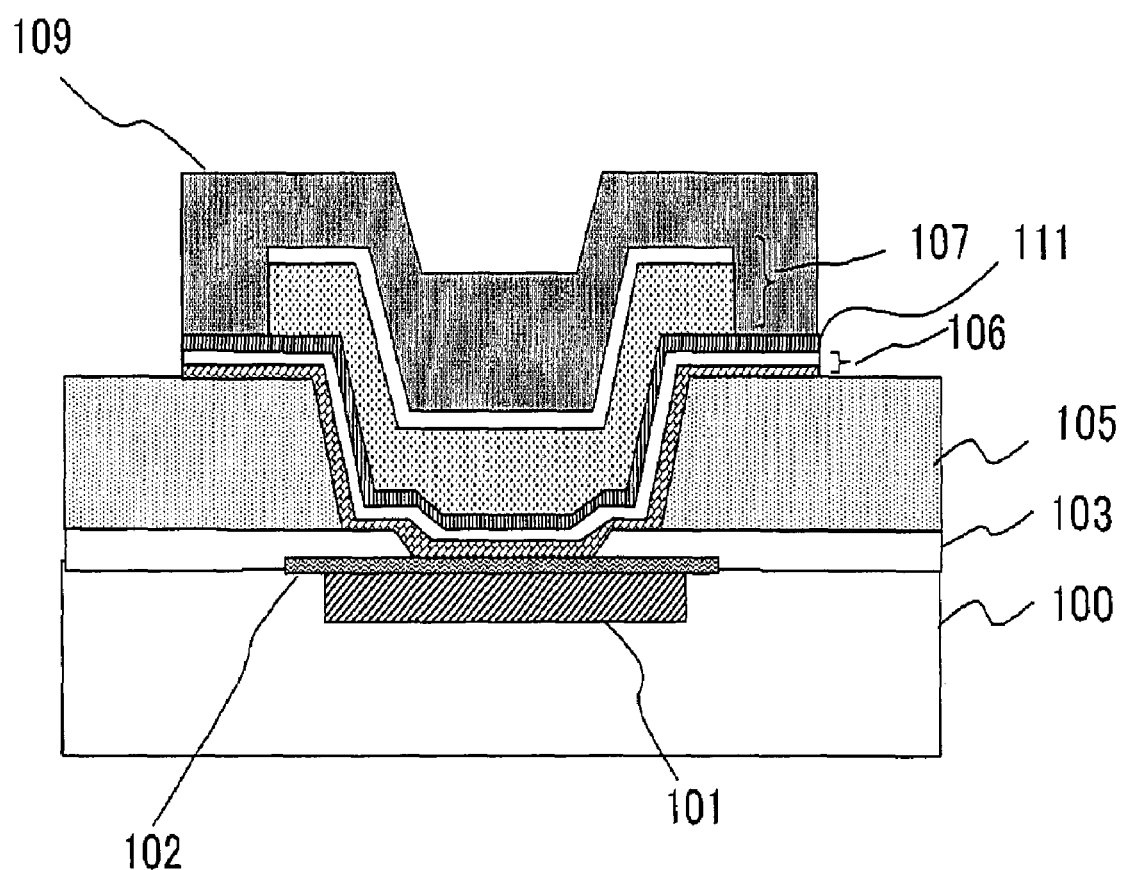
FIG. 11 is a process sectional diagram showing modified example of the first embodiment of the manufacturing process of the semiconductor device.

In the above described embodiment, after the step shown in FIG. 5, the resist 109, which is subjected to the patterning above the UBM film 107, is formed. Thereafter, with the resist 109 as the mask, the Cu film 111 and the barrier metal film 106 are etching-stripped selectively. At this time, the wet etching is used to strip the Cu film 111 and the barrier metal film 106. However, also the dry etching is used to strip the Cu film 111 and the barrier metal film 106. FIG. 11 is a process sectional diagram showing a state after the etching. As shown in FIG. 11, after the dry etching, the Cu film 111 and the barrier metal film 106 are formed in such a way that end faces of respective films constituting the Cu film 111 and the barrier metal film 106 are arranged along the end face of the resist 109. Structure similar to FIG. 7 is realized upon adopting conditions as another condition described above.

Figure 12:
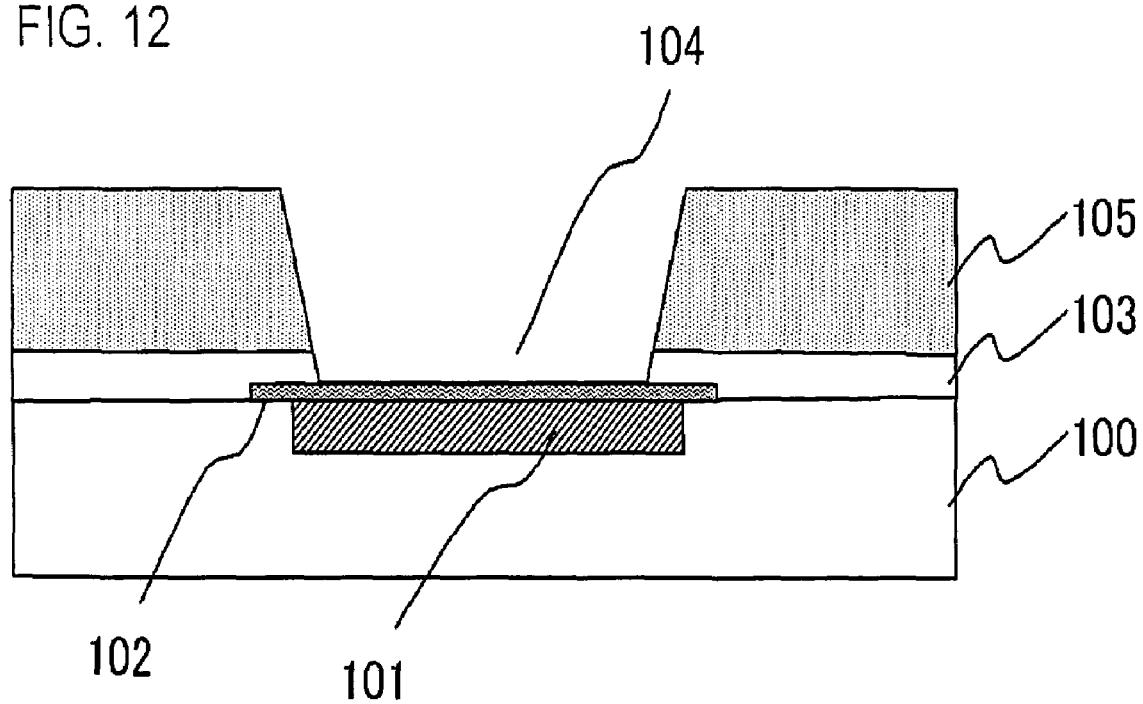
FIG. 12 is a process sectional diagram showing another modified example of the first embodiment of the manufacturing process of the semiconductor device.
Figure 13:
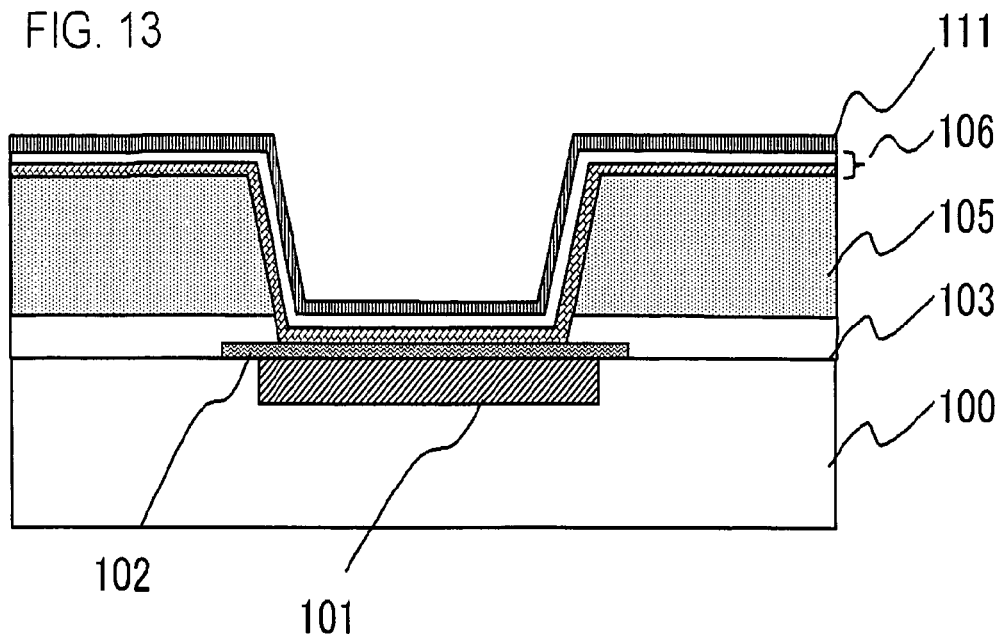
FIG. 13 is a process sectional diagram showing another modified example of the first embodiment of the manufacturing process of the semiconductor device.

In addition, in the above embodiment, in the process shown in FIG. 3, the opening is provided on the passivation film 103. Thereafter, the insulating resin layer 105 is formed. Next, there is adopted a process to open the insulating resin layer 105 wider than the opening to provide a step inside the pad via 104. The pad via 104 is also capable of being formed in such a way as another process. For instance, as shown in FIG. 12, the passivation film 103 is formed, followed by applying a coating liquid including insulating resin, subsequently, exposure is performed using the mask not shown in the drawing to form the insulating resin layer 105 with an opening. Next, the pad via 104 may be formed while performing dry etching the passivation film 103 with the insulating resin layer 105 as the mask. After that, as shown in FIG. 13, the TiW film 113 and the Ti film 112 are formed by the sputtering method to obtain the barrier metal film 106, in addition, the Cu film 111 is formed by the sputtering method. In such a way as above, it is possible to realize the state where the step is not formed inside the pad via 104.

Figure 14:
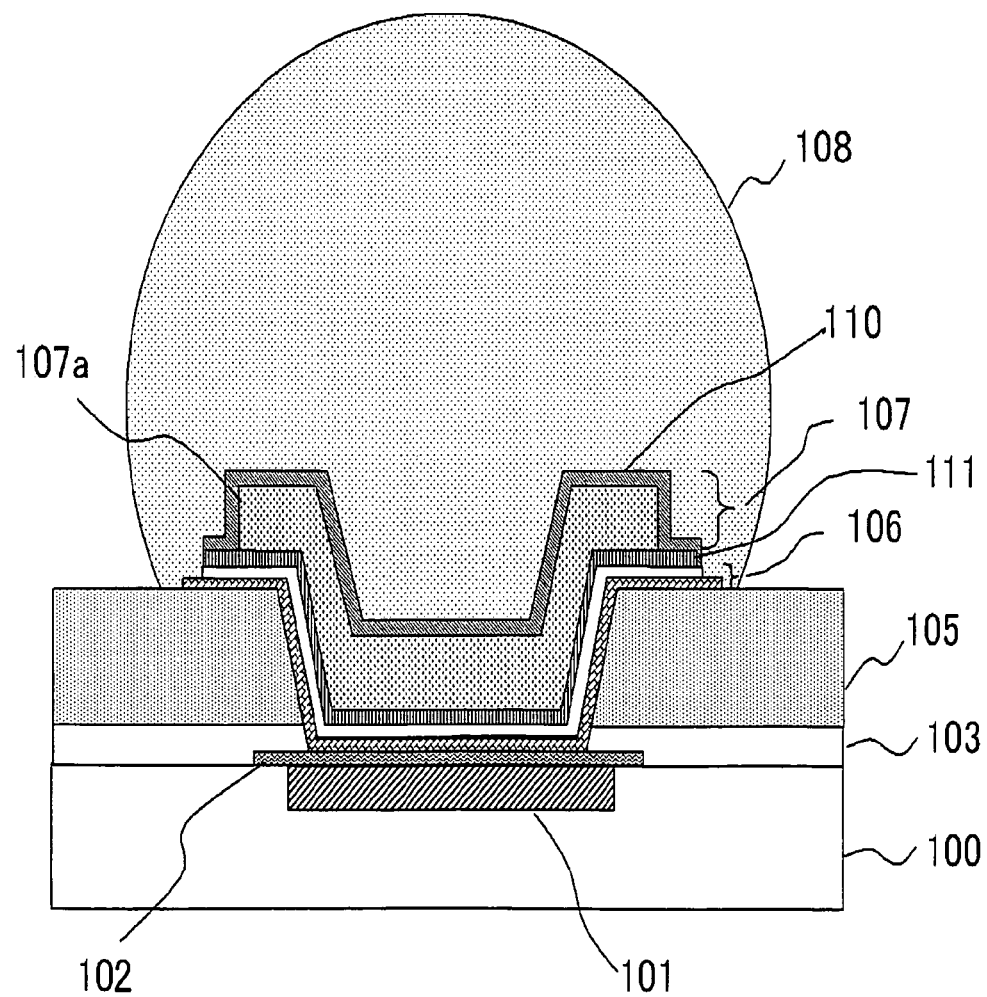
FIG. 14 is a process sectional diagram showing another modified example of the first embodiment of the manufacturing process of the semiconductor device.

Further, as described above, the Ni film 115 and the Cu film 114 are made to grow using the plating method. Subsequently, the resist 109, which is subjected to the patterning, is formed, and then the Cu film 111, the Ti film 112 and the TiW film 113 are subjected to the etching with the resist 109 as the mask. After stripping the resist 109, the solder ball 108 is formed while coming into contact with an upper face of the UBM film 107 (FIG. 14). As for the materials used for the solder ball 108, the conditions of formation of the solder ball 108 and the like, matters described above are indicated. In this case, the alloy layer 110 is formed at the interface between the UBM film 107 and the solder ball 108 and the interface between the Cu film 111 and the solder ball 108 in the reflow process, while the metallic element contained in the solder ball 108 and the elements contained in the UBM film 107 and the Cu film 111 are mutually diffused. In the present embodiment, the alloy layer 110 containing Sn of the solder ball 108, Cu and Ni of the UBM film 107 and Cu of the Cu film 111 is formed.

According to the above processes, the bump structure provided with the solder ball 108 is formed. As shown in FIG. 14, the solder ball 108 is formed in such a way as to cover the whole pad including the UBM film 107. The end faces of the barrier metal film 106 and the UBM film 107 are coated with the solder ball 108. In the above process, such structure can be realized upon setting the opening of the solder printing mask to be wider than the pad.

Second Embodiment

Figure 4:
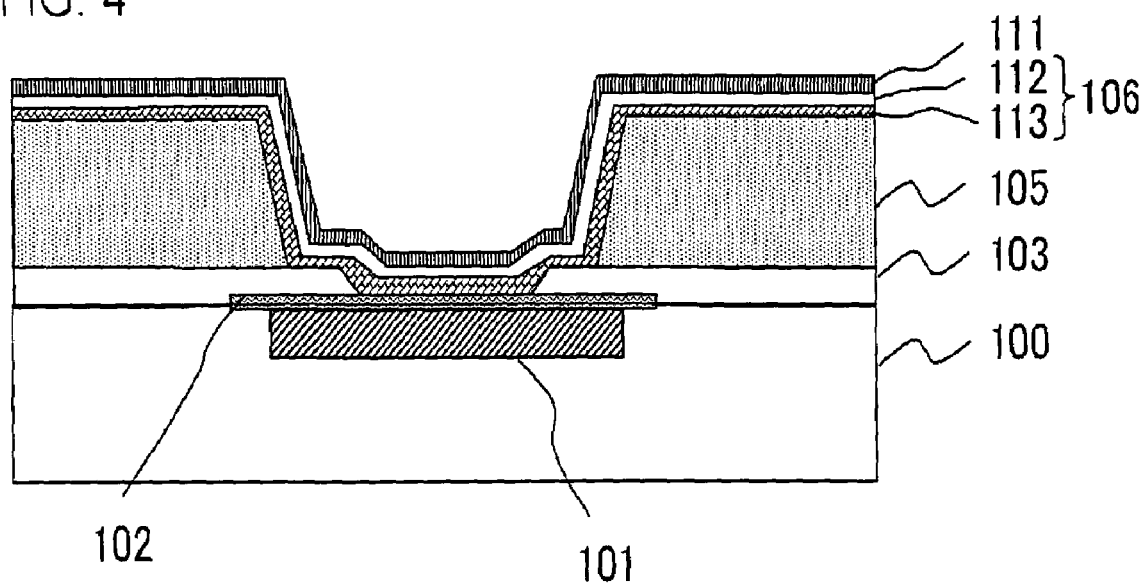
FIG. 4 is a process sectional diagram showing the first embodiment of a manufacturing process of the semiconductor device.
Figure 15:
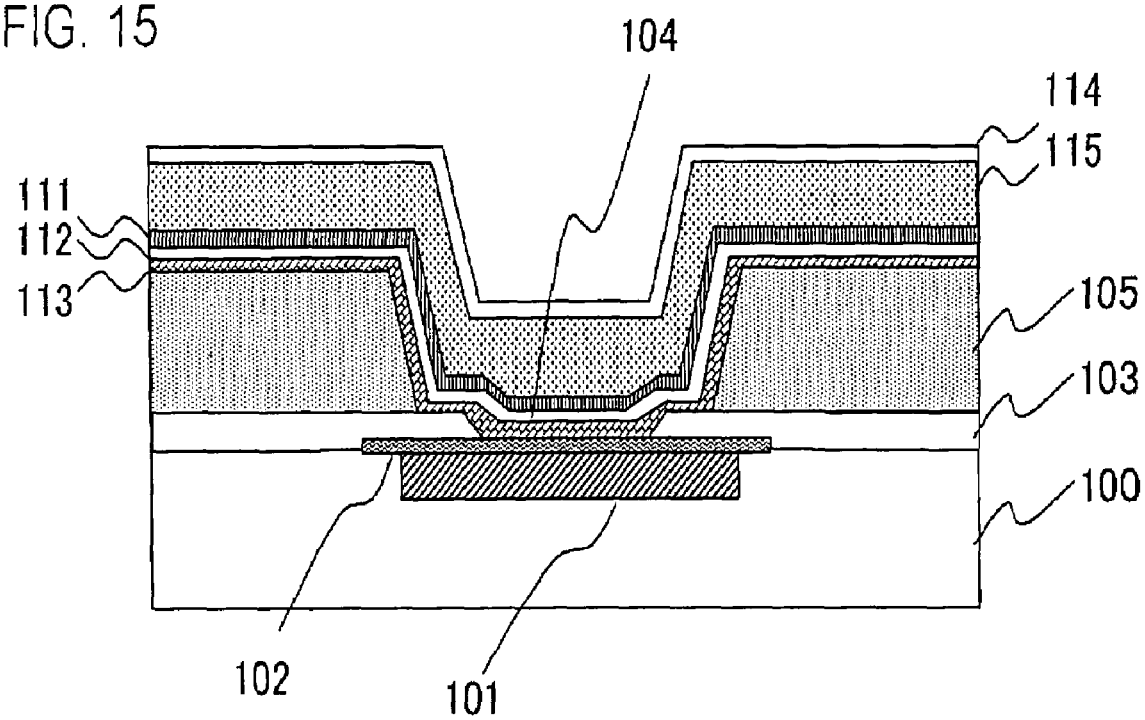
FIG. 15 is a process sectional diagram showing a second embodiment of the manufacturing process of the semiconductor device.

The TiW film 113, the Ti film 112 and the Cu film 111 are formed sequentially upon performing processes until FIG. 4 from FIG. 2 described above, in addition, the Ni film 115 and the Cu film 114 are formed sequentially above the Cu film 111 using the plating method (FIG. 15). Respective film thicknesses may be set to, for instance, the following results.
TiW film 113: 100 to 500 nm
Ti film 112: 10 to 200 nm
Cu film 111: 100 to 500 nm
Ni film 115: 2 to 5 μm
Cu film 114: 200 to 500 nm It should be noted that, in the present embodiment, the film thickness of the TiW film 113 is set to 200 nm, film thickness of the Ti film 112 is set to 30 nm, the film thickness of the Cu film 111 is set to 300 nm, the film thickness of the Ni film 115 is set to 3 μm and the film thickness of the Cu film 114 is set to 400 nm.

Figure 16:
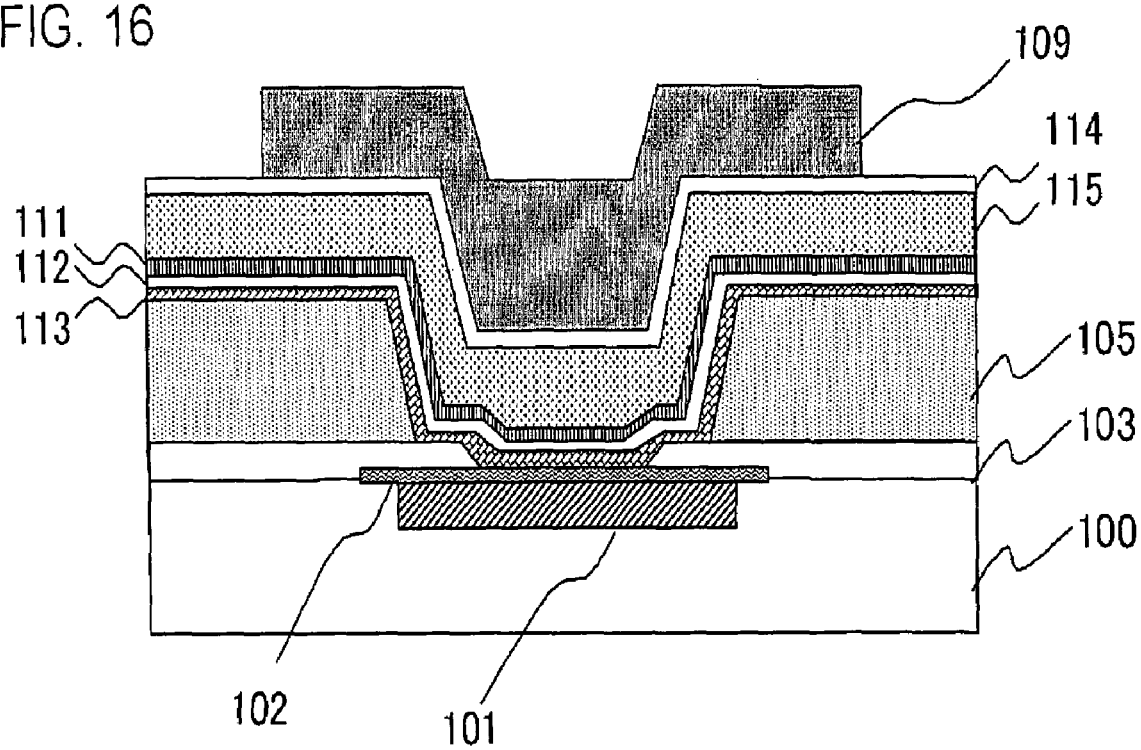
FIG. 16 is a process sectional diagram showing the second embodiment of the manufacturing process of the semiconductor device.
Figure 17:
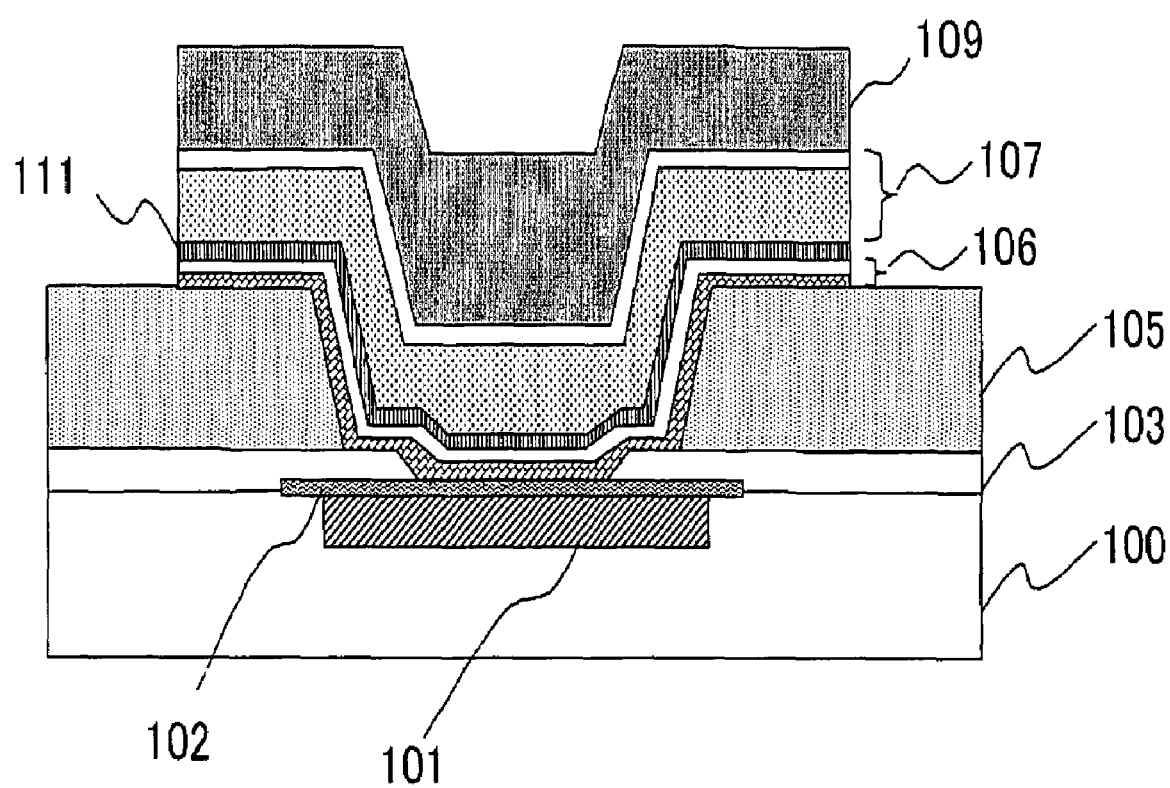
FIG. 17 is a process sectional diagram showing the second embodiment of the manufacturing process of the semiconductor device.

Successively, via the usual process, the resist 109, which is subjected to the patterning so as to cover a part to become the UBM film 107 above the Cu film 114, is formed (FIG. 16). Then, with the resist 109 as the mask, the Cu film 114, the Ni film 115, the Cu film 111, the Ti film 112 and TiW film 113 are selectively etching-stripped. FIG. 17 is a process sectional diagram showing the state after performing the etching.

Figure 18:
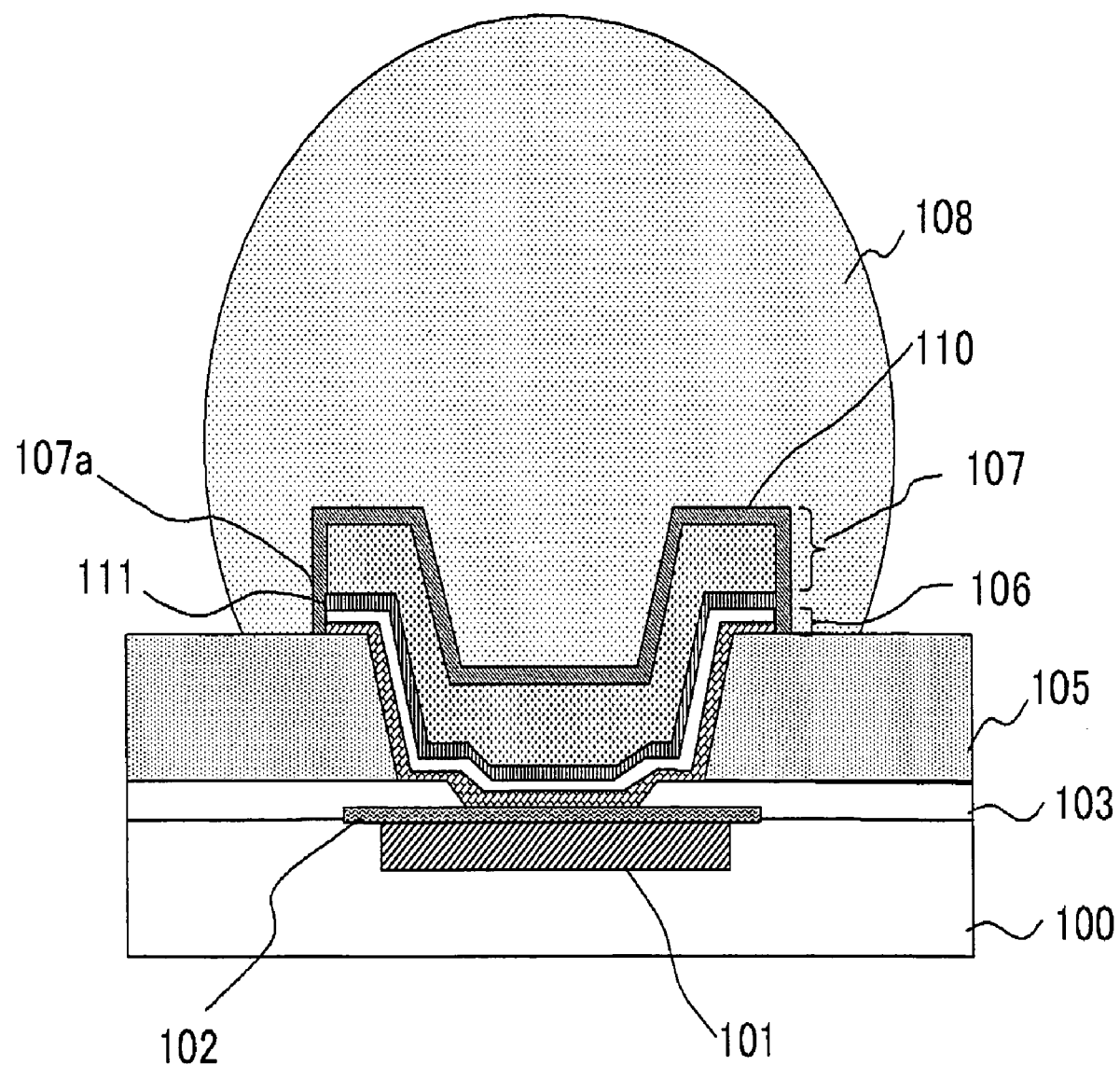
FIG. 18 is a process sectional diagram showing the second embodiment of the manufacturing process of the semiconductor device.

Further, as described above, after stripping the resist 109, the solder ball 108 is formed in such a way as to come into contact with an upper face of the UBM film 107 (FIG. 18). As for the materials used for the solder ball 108, the formation conditions of the solder ball 108 and the like, matters described above are indicated. In the second embodiment, the alloy layer 110 is formed in such a way that the metallic elements contained in the solder ball 108, and the Cu film 114 and the Ni film 115 are mutually diffused at the interface between the UBM film 107 and the solder ball 108 in the reflow process. In the present embodiment, the alloy layer containing Sn of the solder ball 108 and Cu, Ni of the UBM film 107 is formed. As shown in the drawing, this alloy layer 110 is formed across from the upper face of the UBM film 107 to the side face thereof.

By the processes described above, the bump structure provided with the solder ball 108 is formed. As shown in FIG. 18, the solder ball 108 is formed so as to cover the whole pad including the UBM film 107. The end faces of the barrier metal film 106 and the UBM film 107 and the Cu film are coated with the solder ball 108. In the above process, such structure is realized upon setting the opening of the solder printing mask to be wider than the pad.

Figure 19:
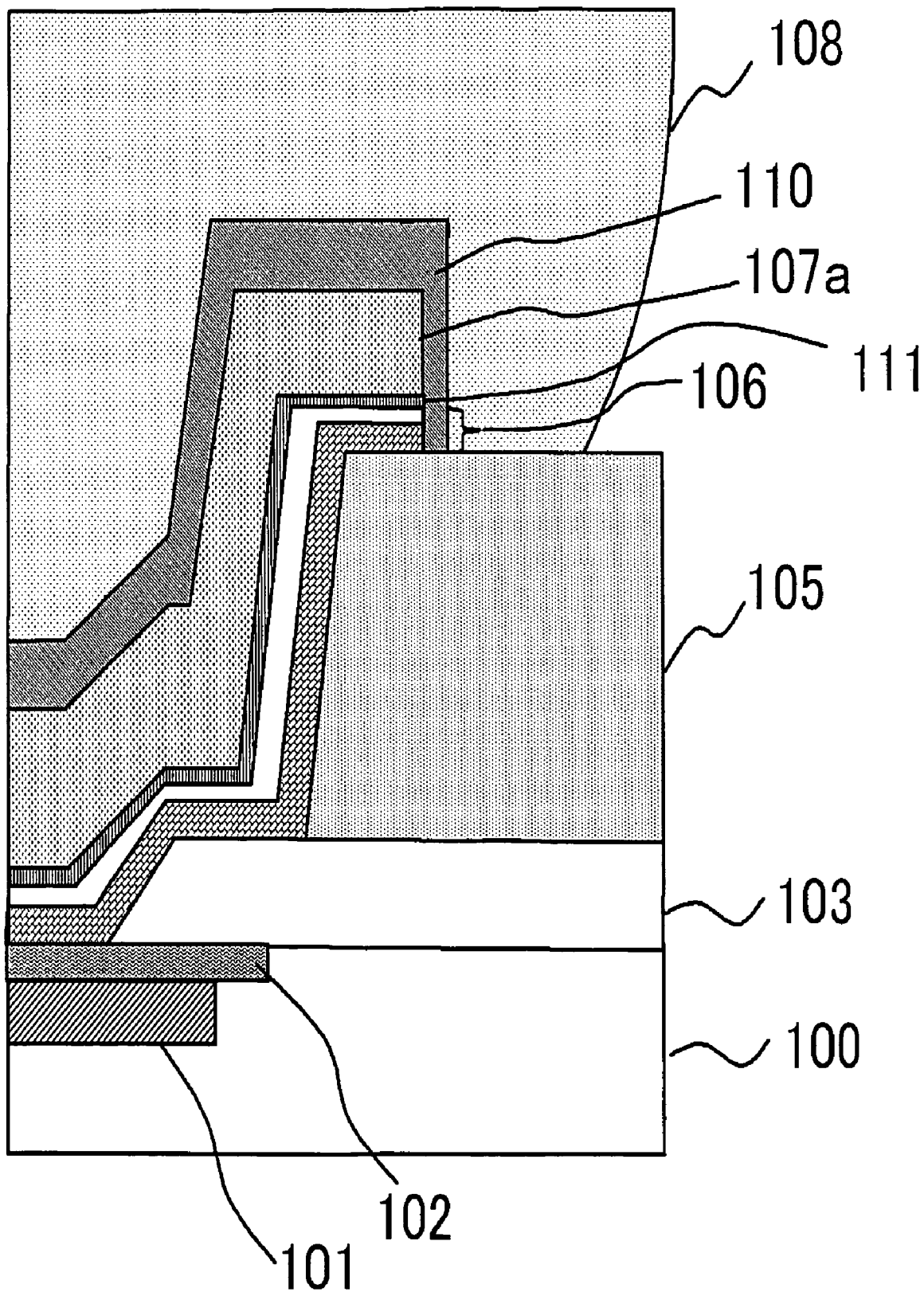
FIG. 19 is a diagram showing an enlarged part near a terminal of the solder ball of the semiconductor device.

FIG. 19 is a diagram showing the solder ball 108 while enlarging a part near the terminal of the solder ball 108.

Figure 20:
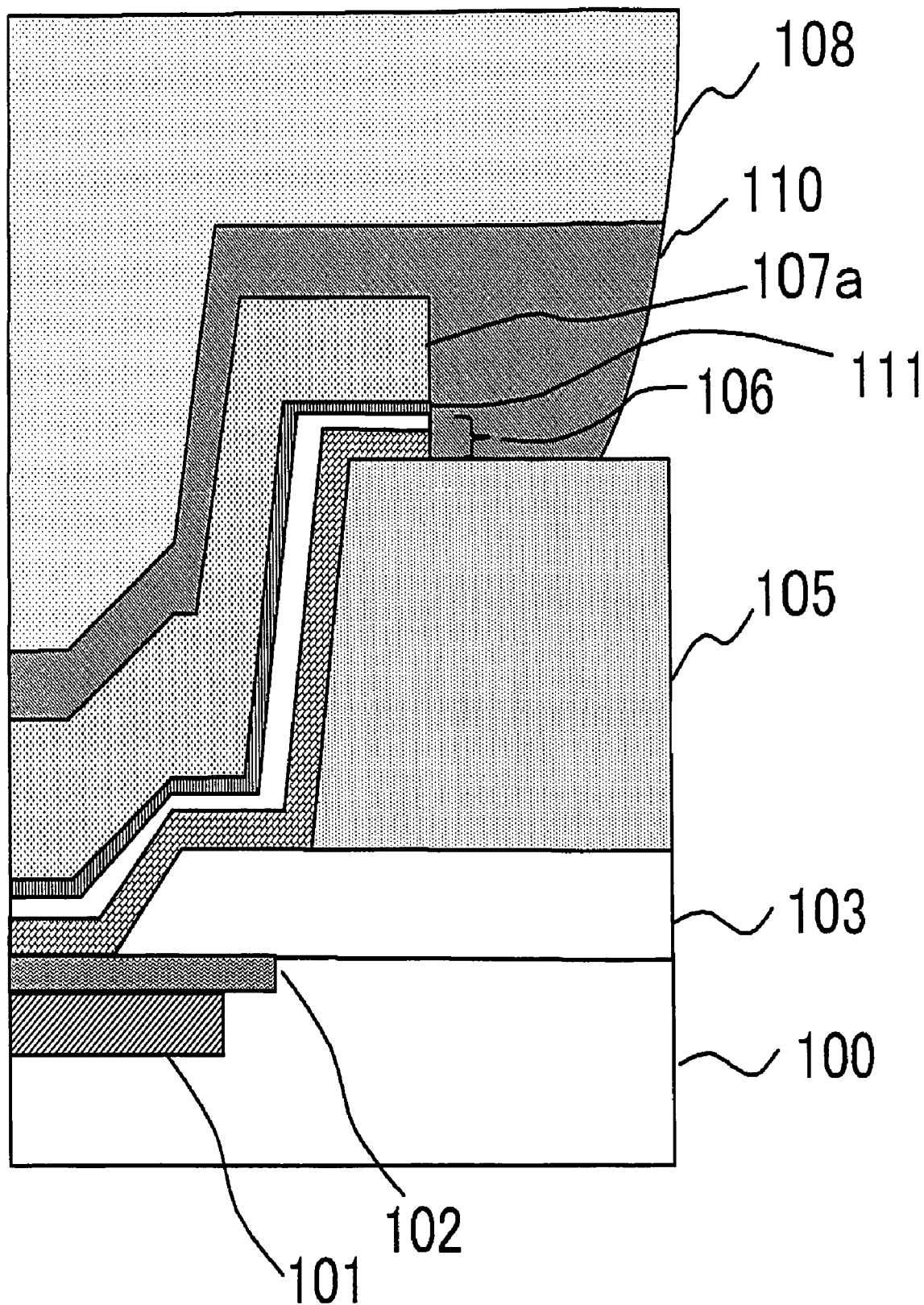
FIG. 20 is an enlarged diagram showing a part near a terminal of the solder ball of the semiconductor device whose alloy layer is exposed to outside thereof.

As shown in FIG. 19, in the formation process of the solder ball 108, the alloy layer 110 is formed along the end face 107a of the UBM film 107 so that the alloy layer 110 does not grow up to the terminal part of the solder ball 108. In addition, at this time, the terminal part of the solder ball 108 may be positioned outside the terminal part of the UBM film 107 by not less than 10 μm. Thereby, in the formation process of the solder ball 108, even though the alloy layer 110 grows to be formed, this growth stops at the position along the end face 107a of the UBM film 107. That is, as shown in FIG. 20, the alloy layer 110 results in the shape where the alloy layer 110 is not exposed outside the solder ball 108. Thereby, it is possible to prevent the interfacial breakdown from occurring caused by exposure of the alloy layer 110.

It should be noted that a film corresponding to the Ni film 115 forming the UBM film 107 is formed with the sputtering method, while using nickel vanadium alloy (Ni—V) instead of Ni as the material. Thereafter, the Cu film 114 may be formed upon performing sputtering Cu. Such nickel vanadium alloy (Ni—V) film is capable of being formed with the sputtering of degree of 3000 to 4000 angstroms (300 to 400 nm).

As above, the embodiment of the present invention is described. It should go without saying that the embodiment is changeable within the range of the object of the invention. For instance, the lead-free solder is used as the solder to form the solder ball; the solder with lead is safely used.

In addition, in the present embodiment, there is described a mode where the solder ball seals the barrier metal film 106 too. However, when the barrier metal film is formed with such material of the barrier metal film 106 by which the solder and the alloy layer are not formed, as used in the present embodiment, the terminal part of the solder ball may position inside the terminal of the barrier metal film as long as the terminal part of the solder ball positions outside the metal film. That is, the terminal part of the barrier metal film may also position outside the terminal part of the solder ball.

EMBODIMENT EXAMPLE 1

Hereinafter, there will be described the present invention using an embodiment example. It should go without saying that the present invention is not limited to the embodiment example.

In the present embodiment example, the semiconductor device has been formed based on the process described in the first embodiment. Here, in the formation process of the solder ball described while referring to FIG. 7, the mask shown in FIG. 21 is used. FIG. 21 is a diagram in which the UBM film 107 and the opening 116 of the solder printing mask are seen from the upper face. As shown in the drawing, the UBM film 107 has an octagonal shape seen from the upper face. Distance between opposed sides is 100 μm. Diameter of the opening 116 of the solder printing mask with approximately circular shape is set to 150 μm.

The solder ball 108 is formed via the reflow process upon printing the solder material according to the screen printing method using this mask. The formation condition of the solder ball 108 is just as following one.
Solder material: lead-free solder containing Sn, Ag and Cu;
Reflow condition: 220 to 260° C.;
Peak temperature sustaining time: 1 to 2 minute;

Here, the good product coefficient is obtained upon performing a heat cycle test with more rigorous condition of −55° C. to +125° C. than the condition −45° C. to +125° C., which indicates usual reliability. In addition, as a comparison, likewise, the good product coefficient is obtained upon performing the heat cycle test while manufacturing the semiconductor device in which the alloy layer (inter-metallic compound) is exposed. It should be noted that, in order to perform evaluation, respective 50-samples are used.

Figure 22:
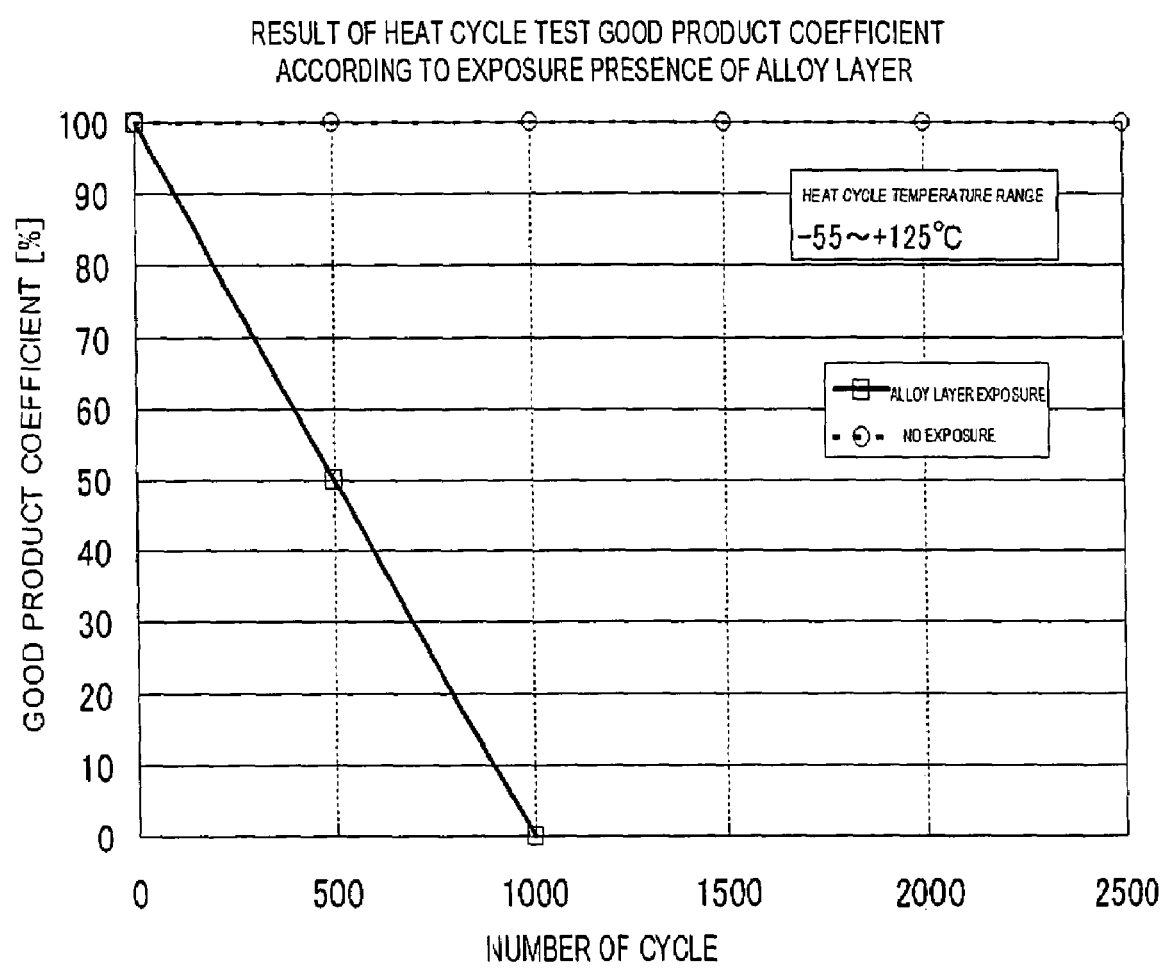
FIG. 22 is a graph showing result where reliability of the semiconductor device is evaluated.

Both these results are shown in FIG. 22.

According to FIG. 22, in the semiconductor device in which the alloy layer is exposed, when exceeding 1000 cycles, the good product coefficient nears zero. On the contrary, in the semiconductor device in which the alloy layer is not exposed, even when it reaches 2500 cycles, it results in the state that the good product coefficient does not decrease from 100%.

Figure 23:
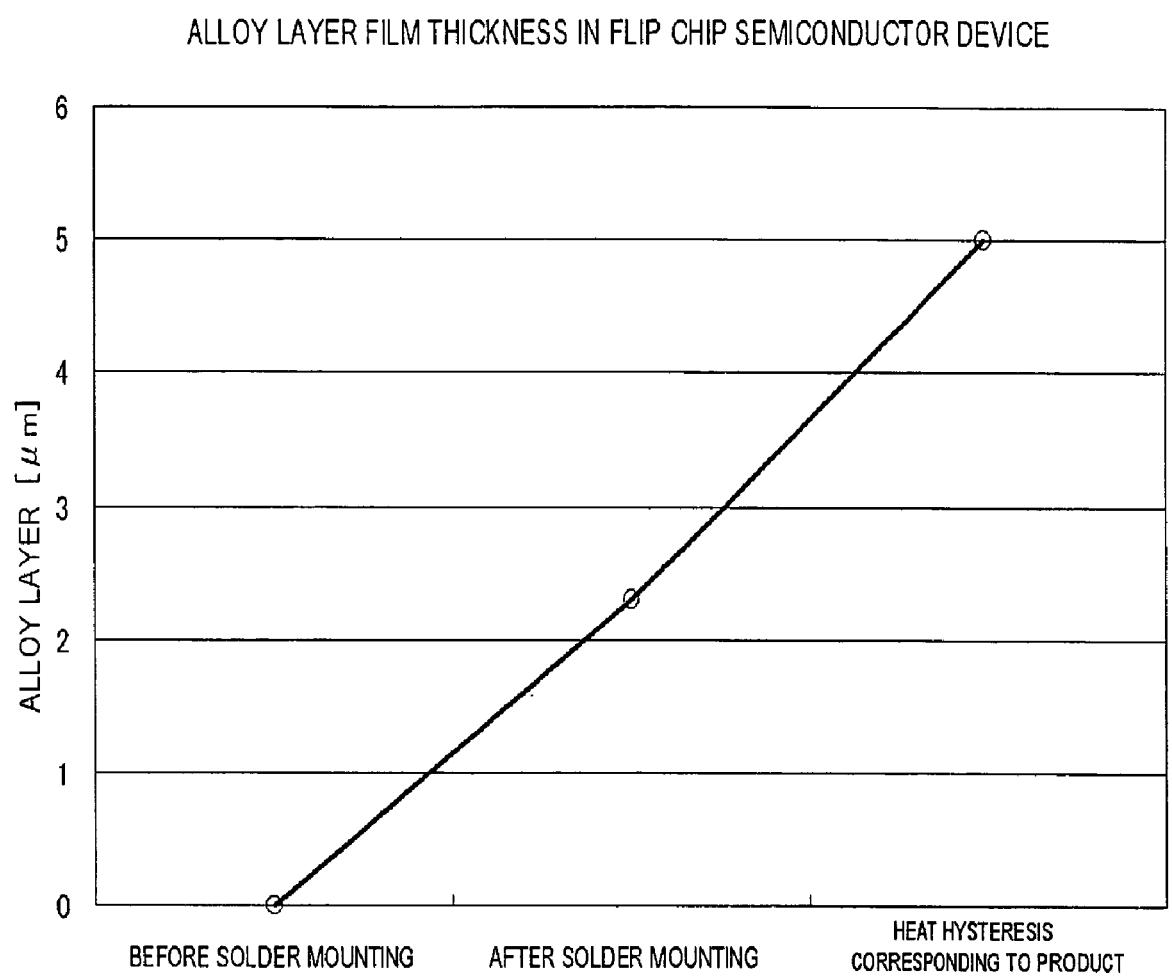
FIG. 23 is a graph showing result of alloy layer formation confirmation test of the semiconductor device formed in the present embodiment.

In addition, FIG. 23 is a graph showing confirmation of being formed the alloy layer in the semiconductor device manufactured in the present embodiment example. The formation of the alloy layer has been confirmed with SEM (scanning electron microscope).

According to FIG. 23, the alloy layer is not detected before mounting solder. On the contrary, after mounting solder, the alloy layer with approximately 2.3 micro meters is observed, further, in the observation in consideration of a heat hysteresis corresponding to a state after mounting processing according to flip chip form, the alloy layer of 5 micro meters is confirmed.

It is apparent that the present invention is not limited to the above embodiment that modified and changed without departing from the scope and sprit of the invention.

What is claimed is:

1. A semiconductor device, comprising:
a lead-free solder ball above an electrode; and
a conductive film between said lead-free solder ball and said electrode, wherein:
an alloy layer is between said conductive film and said lead-free solder ball, and a first metallic element contained in said lead-free solder ball and not contained in said conductive film and a second metallic element contained in said conductive film is contained in said alloy layer, and said lead-free solder ball is formed so as to cover said alloy layer so that the alloy layer is not exposed to an exterior,
wherein said alloy layer is a single layer.

2. A semiconductor device, comprising:
an interconnection;
an insulating film, above said interconnection, providing a hole reaching said interconnection;
a conductive film, which is connected to said interconnection in a bottom of said hole and formed across the bottom of said hole to outside said hole; and
a lead-free solder ball in contact with said conductive film and said insulating film,
wherein an alloy layer is between said conductive film and said lead-free solder ball, said alloy layer containing a first metallic element contained in said lead-free solder ball and not contained in said conductive film and a second metallic element contained in said conductive film, and said lead-free solder ball is formed so as to cover said alloy layer so that the alloy layer is not exposed to an exterior,
wherein said alloy layer is a single layer.

3. The semiconductor device according to claim 2, wherein said insulating film is constituted by forming a protection layer provided above said interconnection and an insulating resin layer provided above said protection layer into layered structure in this order.

4. The semiconductor device according to claim 1, wherein said conductive film contains at least copper and nickel, contains a ball underlying metal film containing at least material indicating wettability to the solder, which is subjected to reflow to a face being in contact with the solder ball.

5. The semiconductor device according to claim 2, wherein said conductive film contains at least copper and nickel, contains a ball underlying metal film containing at least material indicating wettability to the solder, which is subjected to reflow to a face being in contact with the solder ball.

6. The semiconductor device according to claim 4, at least one kind of metal of copper, gold and chrome is contained in said ball underlying metal film in its face coming into contact with the solder ball.

7. The semiconductor device according to claim 5, at least one kind of metal of copper, gold and chrome is contained in said ball underlying metal film in its face coming into contact with the solder ball.

8. The semiconductor device according to claim 4, wherein said conductive film comprises said ball underlying metal film, a metal film in which a solder subjected to reflow to a face being in contact with said ball underlying metal film contains at least material indicating wettability, and a barrier metal film.

9. The semiconductor device according to claim 5, wherein said conductive film comprises said ball underlying metal film, a metal film in which a solder subjected to reflow to a face being in contact with said ball underlying metal film contains at least material indicating wettability, and a barrier metal film.

10. The semiconductor device according to claim 8, wherein said metal film is formed between said ball underlying metal film and said barrier metal film; and said barrier metal film has at least a titanium layer on its face being in contact with said metal film.

11. The semiconductor device according to claim 9, wherein said metal film is formed between said ball underlying metal film and said barrier metal film; and said barrier metal film has at least a titanium layer on its face being in contact with said metal film.

12. The semiconductor device according to claim 8, wherein said barrier metal film comprises at least a titanium layer and a titanium-tungsten layer in the order from a face being in contact with said metal film.

13. The semiconductor device according to claim 9, wherein said barrier metal film comprises at least a titanium layer and a titanium-tungsten layer in the order from a face being in contact with said metal film.

14. The semiconductor device according to claim 8, wherein said barrier metal film and said metal film are formed to be exposed to the exterior of the terminal side than said ball underlying metal film; and said solder ball is formed at least so as to seal said metal film and said ball underlying metal film.

15. The semiconductor device according to claim 9, wherein said barrier metal film and said metal film are formed to be exposed to the exterior of the terminal side than said ball underlying metal film; and said solder ball is formed at least so as to seal said metal film and said ball underlying metal film.

16. The semiconductor device according to claim 14, wherein the terminal part of said solder ball is positioned outside the terminal part of said ball underlying metal film with not less than 10 μm separated.

17. The semiconductor device according to claim 15, wherein the terminal part of said solder ball is positioned outside the terminal part of said ball underlying metal film with not less than 10 μm separated.

18. The semiconductor device according to claim 1, wherein said solder ball is composed of a lead-free solder containing tin.

19. The semiconductor device according to claim 2, wherein said solder ball is composed of a lead-free solder containing tin.

20. The semiconductor device according to claim 1, wherein the alloy layer is formed over an end face of the conductive film.

21. The semiconductor device according to claim 2, wherein the alloy layer is formed over an end face of the conductive film.

22. The semiconductor device according to claim 1, wherein the alloy layer comprises Sn, Cu and Ni.

23. The semiconductor device according to claim 2, wherein the alloy layer comprises Sn, Cu and Ni.

* * * * *